United States Patent
Darveaux

(10) Patent No.: US 10,593,565 B2
(45) Date of Patent: Mar. 17, 2020

(54) CONTROL OF UNDER-FILL WITH A PACKAGING SUBSTRATE HAVING AN INTEGRATED TRENCH FOR A DUAL-SIDED BALL GRID ARRAY PACKAGE

(71) Applicant: SKYWORKS SOLUTIONS, INC., Woburn, MA (US)

(72) Inventor: Robert Francis Darveaux, Corona Del Mar, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/885,782

(22) Filed: Jan. 31, 2018

(65) Prior Publication Data

US 2018/0218922 A1    Aug. 2, 2018

Related U.S. Application Data

(60) Provisional application No. 62/452,460, filed on Jan. 31, 2017, provisional application No. 62/452,458, (Continued)

(51) Int. Cl.
*H01L 21/00* (2006.01)
*H01L 21/56* (2006.01)
(Continued)

(52) U.S. Cl.
CPC .......... *H01L 21/563* (2013.01); *H01L 21/268* (2013.01); *H01L 21/481* (2013.01); *H01L 21/4853* (2013.01); *H01L 21/4864* (2013.01); *H01L 21/561* (2013.01); *H01L 21/568* (2013.01); *H01L 21/6836* (2013.01); *H01L 21/78* (2013.01); *H01L 23/293* (2013.01); (Continued)

(58) Field of Classification Search
USPC .......................................... 438/108
See application file for complete search history.

(56) References Cited

U.S. PATENT DOCUMENTS

| 6,121,689 A | 9/2000 | Capote et al. |
| 6,291,264 B1 | 9/2001 | Tang et al. |

(Continued)

FOREIGN PATENT DOCUMENTS

KR    10-1236797 B1    2/2013

OTHER PUBLICATIONS

International Search Report and Written Opinion dated Jun. 1, 2018 for PCT/US2018/016326.

*Primary Examiner* — Caleb E Henry
(74) *Attorney, Agent, or Firm* — Chang & Hale LLP

(57) ABSTRACT

Described herein are methods of manufacturing dual-sided packaged electronic modules to control the distribution of an under-fill material between one or more components and a packaging substrate. The disclosed technologies include forming a trench in a packaging substrate that is configured to prevent or limit the flow of a capillary under-fill material. This can prevent or limit the capillary under-fill material from flowing onto or contacting other components or elements on the packaging substrate, such as solder balls of a ball-grid array. Accordingly, the disclosed technologies control under-fill for dual-sided ball grid array packages using a trench in a packaging substrate.

10 Claims, 13 Drawing Sheets

Related U.S. Application Data filed on Jan. 31, 2017, provisional application No. 62/452,450, filed on Jan. 31, 2017, provisional application No. 62/452,457, filed on Jan. 31, 2017, provisional application No. 62/452,452, filed on Jan. 31, 2017.

(51) Int. Cl.

| | |
|---|---|
| H01L 21/48 | (2006.01) |
| H01L 23/552 | (2006.01) |
| H01L 23/00 | (2006.01) |
| H01L 23/544 | (2006.01) |
| H01L 21/268 | (2006.01) |
| H01L 21/683 | (2006.01) |
| H01L 21/78 | (2006.01) |
| H01L 23/31 | (2006.01) |
| H01L 23/538 | (2006.01) |
| H01L 25/065 | (2006.01) |
| H01L 25/00 | (2006.01) |
| H01L 23/29 | (2006.01) |
| H01L 23/498 | (2006.01) |
| H01L 25/16 | (2006.01) |
| H01L 21/027 | (2006.01) |

(52) U.S. Cl.
CPC ...... *H01L 23/3135* (2013.01); *H01L 23/5383* (2013.01); *H01L 23/5386* (2013.01); *H01L 23/544* (2013.01); *H01L 23/552* (2013.01); *H01L 24/16* (2013.01); *H01L 24/32* (2013.01); *H01L 24/73* (2013.01); *H01L 24/83* (2013.01); *H01L 24/97* (2013.01); *H01L 25/0657* (2013.01); *H01L 25/50* (2013.01); *H01L 21/0274* (2013.01); *H01L 23/3128* (2013.01); *H01L 23/49816* (2013.01); *H01L 24/48* (2013.01); *H01L 24/81* (2013.01); *H01L 24/85* (2013.01); *H01L 24/92* (2013.01); *H01L 25/16* (2013.01); *H01L 2223/54486* (2013.01); *H01L 2224/16227* (2013.01); *H01L 2224/26175* (2013.01); *H01L 2224/2919* (2013.01); *H01L 2224/32155* (2013.01); *H01L 2224/32225* (2013.01); *H01L 2224/32227* (2013.01); *H01L 2224/48091* (2013.01); *H01L 2224/48106* (2013.01); *H01L 2224/48227* (2013.01); *H01L 2224/73204* (2013.01); *H01L 2224/73265* (2013.01); *H01L 2224/831* (2013.01); *H01L 2224/83002* (2013.01); *H01L 2224/83007* (2013.01); *H01L 2224/83855* (2013.01); *H01L 2224/92125* (2013.01); *H01L 2224/92225* (2013.01); *H01L 2224/92247* (2013.01); *H01L 2225/0651* (2013.01); *H01L 2225/06517* (2013.01); *H01L 2225/06572* (2013.01); *H01L 2225/06586* (2013.01); *H01L 2924/0665* (2013.01); *H01L 2924/1421* (2013.01); *H01L 2924/19011* (2013.01); *H01L 2924/19105* (2013.01); *H01L 2924/3025* (2013.01)

(56) References Cited

U.S. PATENT DOCUMENTS

| | | | | |
|---|---|---|---|---|
| 6,546,620 B1* | 4/2003 | Juskey | ............... | H01L 24/81 228/180.21 |
| 6,770,510 B1* | 8/2004 | Su | ............... | H01L 21/563 438/108 |
| 6,803,324 B2* | 10/2004 | Ogawa | ............... | H01L 21/4846 257/669 |
| 7,576,434 B2 | 8/2009 | Mancera et al. | | |
| 7,754,530 B2* | 7/2010 | Wu | ............... | H01L 21/56 257/E21.499 |
| 8,314,499 B2 | 11/2012 | Liu | | |
| 8,389,339 B2 | 3/2013 | Tanuma et al. | | |
| 8,399,300 B2* | 3/2013 | Lee | ............... | H01L 21/563 257/778 |
| 8,982,577 B1* | 3/2015 | Fuentes | ............... | H01L 23/13 257/787 |
| 9,381,529 B2* | 7/2016 | Read | ............... | B05B 9/042 |
| 9,385,095 B2* | 7/2016 | Jeng | ............... | H01L 23/3128 |
| 9,609,746 B1* | 3/2017 | Chiang | ............... | H05K 1/115 |
| 10,297,582 B2* | 5/2019 | Caskey | ............... | H05K 1/0298 |
| 2002/0121705 A1 | 9/2002 | Pu et al. | | |
| 2004/0102028 A1* | 5/2004 | Hsieh | ............... | H01L 21/4846 438/611 |
| 2004/0222508 A1 | 11/2004 | Aoyagi | | |
| 2007/0045867 A1* | 3/2007 | Machida | ............... | H01L 21/563 257/778 |
| 2007/0235864 A1 | 10/2007 | Megahed | | |
| 2008/0017994 A1 | 1/2008 | Do et al. | | |
| 2008/0205008 A1* | 8/2008 | Sun | ............... | H01L 25/16 361/736 |
| 2008/0237892 A1 | 10/2008 | Saeki | | |
| 2009/0001606 A1 | 1/2009 | Tamadate | | |
| 2009/0170242 A1 | 7/2009 | Lin et al. | | |
| 2009/0211795 A1 | 8/2009 | Shirasawa | | |
| 2010/0102447 A1* | 4/2010 | Huang | ............... | H01L 23/13 257/738 |
| 2011/0115083 A1* | 5/2011 | Zang | ............... | H01L 21/563 257/738 |
| 2011/0140105 A1* | 6/2011 | Maruyama | ............... | H01L 22/32 257/48 |
| 2011/0260338 A1 | 10/2011 | Lee et al. | | |
| 2011/0316170 A1 | 12/2011 | Muramatsu et al. | | |
| 2012/0083073 A1 | 4/2012 | Tanuma et al. | | |
| 2012/0187583 A1 | 7/2012 | Karpur et al. | | |
| 2012/0211885 A1 | 8/2012 | Choi et al. | | |
| 2012/0313240 A1 | 12/2012 | Cheng et al. | | |
| 2012/0319300 A1 | 12/2012 | Kim et al. | | |
| 2013/0095608 A1 | 4/2013 | Chen et al. | | |
| 2013/0214430 A1 | 8/2013 | Pagaila | | |
| 2014/0001644 A1 | 1/2014 | Yu et al. | | |
| 2014/0048934 A1* | 2/2014 | Chen | ............... | H01L 21/563 257/738 |
| 2014/0061945 A1* | 3/2014 | Zhao | ............... | H01L 24/17 257/774 |
| 2014/0070348 A1 | 3/2014 | Yee et al. | | |
| 2014/0103527 A1* | 4/2014 | Marimuthu | ............... | H01L 21/6835 257/737 |
| 2014/0117555 A1 | 5/2014 | Liang et al. | | |
| 2014/0167263 A1 | 6/2014 | Wu et al. | | |
| 2014/0177149 A1* | 6/2014 | Rannalingam | ............... | H01L 24/29 361/679.02 |
| 2015/0001729 A1 | 1/2015 | Lan et al. | | |
| 2015/0014863 A1 | 1/2015 | Shih et al. | | |
| 2015/0255312 A1 | 9/2015 | Brofman et al. | | |
| 2015/0279820 A1 | 10/2015 | Usami et al. | | |
| 2015/0285702 A1 | 10/2015 | Lo | | |
| 2016/0111375 A1* | 4/2016 | Bair | ............... | H01L 23/552 438/110 |
| 2016/0218093 A1 | 7/2016 | Mortensen et al. | | |
| 2016/0254169 A1 | 9/2016 | Liang et al. | | |
| 2016/0254249 A1* | 9/2016 | Jeng | ............... | H01L 23/3128 257/692 |
| 2016/0260690 A1 | 9/2016 | Ganesan et al. | | |
| 2017/0084594 A1* | 3/2017 | Na | ............... | H01L 23/3128 |
| 2017/0092594 A1 | 3/2017 | Song et al. | | |
| 2017/0317041 A1 | 11/2017 | Yeh et al. | | |
| 2018/0096949 A1* | 4/2018 | Chen | ............... | H05K 1/181 |
| 2018/0096950 A1* | 4/2018 | Chen | ............... | H05K 1/181 |
| 2018/0226271 A1 | 8/2018 | Chen et al. | | |
| 2018/0226272 A1 | 8/2018 | Darveaux | | |
| 2018/0226273 A1 | 8/2018 | Darveaux et al. | | |
| 2018/0226274 A1 | 8/2018 | Darveaux | | |

* cited by examiner

CONTROL OF UNDER-FILL WITH A PACKAGING SUBSTRATE HAVING AN INTEGRATED TRENCH FOR A DUAL-SIDED BALL GRID ARRAY PACKAGE

CROSS-REFERENCE TO RELATED APPLICATIONS

This application claims priority to U.S. Provisional Application No. 62/452,450 filed Jan. 31, 2017 and entitled "CONTROL OF UNDER-FILL USING A FILM DURING FABRICATION FOR A DUAL-SIDED BALL GRID ARRAY PACKAGE," to U.S. Provisional Application No. 62/452,452 filed Jan. 31, 2017 and entitled "CONTROL OF UNDER-FILL USING UNDER-FILL DEFLASH FOR A DUAL-SIDED BALL GRID ARRAY PACKAGE," to U.S. Provisional Application No. 62/452,457 filed Jan. 31, 2017 and entitled "CONTROL OF UNDER-FILL USING A FILM DURING FABRICATION FOR A DUAL-SIDED BALL GRID ARRAY PACKAGE," to U.S. Provisional Application No. 62/452,458 filed Jan. 31, 2017 and entitled "CONTROL OF UNDER-FILL WITH A PACKAGING SUBSTRATE HAVING AN INTEGRATED TRENCH FOR A DUAL-SIDED BALL GRID ARRAY PACKAGE," and to U.S. Provisional Application No. 62/452,460 filed Jan. 31, 2017 and entitled "CONTROL OF UNDER-FILL USING AN ENCAPSULANT FOR A DUAL-SIDED BALL GRID ARRAY PACKAGE," each of which is expressly incorporated by reference herein in its entirety for all purposes.

This application is also related to U.S. Pat. No. 9,381,529 issued Jul. 5, 2016 and entitled "SYSTEMS, DEVICES AND METHODS RELATED TO PAINT RECIRCULATION DURING MANUFACTURE OF RADIO-FREQUENCY MODULES," and to U.S. patent application Ser. No. 15/724,722 filed Oct. 4, 2017 and entitled "DUAL-SIDED RADIO-FREQUENCY PACKAGE WITH OVERMOLD STRUCTURE," each of which is expressly incorporated by reference herein in its entirety for all purposes.

BACKGROUND

Field

The present disclosure generally relates to fabrication of dual-sided packaged electronic modules.

Description of Related Art

The present disclosure relates to fabrication of packaged electronic modules such as radio-frequency (RF) modules. In radio-frequency applications, RF circuits and related devices can be implemented in a packaged module. Such a packaged module can then be mounted on a circuit board such as a phone board.

SUMMARY

According to a number of implementations, the present disclosure relates to a method of fabricating a packaged radio-frequency device. The method includes mounting components to a first side of a packaging substrate. The method also includes applying a film to a second side of a packaging substrate. The method also includes mounting a lower component to the second side of the packaging substrate after application of the film. The method also includes under-filling the lower component mounted on the second side of the packaging substrate with an under-fill agent. The method also includes removing the film on the second side of the packaging substrate. The method also includes mounting solder balls to the second side of the packaging substrate after removal of the film.

In some embodiments, the film covers contact pads of the solder balls. In some embodiments, applying the film includes laser cutting openings in a tape adhesive and mounting strips to the film.

The method also includes applying the film includes covering a first area of the second side of the packaging substrate while a second area of the second side of the packaging substrate remains uncovered by the film. In further embodiments, the first area includes a plurality of contact pads for the solder balls. In further embodiments, the second area includes a die area where the lower-component is mounted.

In some embodiments, a size of a keep out zone is reduced by application and removal of the film. In some embodiments, the under-fill agent at least partially covers the film prior to removal of the film. In further embodiments, the film prevents the under-fill agent from coating contact pads of the solder balls.

According to a number of implementations, the present disclosure relates to a method for manufacturing packaged radio-frequency devices. The method includes applying a film to an underside of a packaging substrate, the packaging substrate having an upper side with one or more upper components mounted thereto, the underside of the packaging substrate having a die area and a contact pad area having a plurality of contact pads for through-mold connections, application of the film including covering the contact pad area with the film while leaving the die area uncovered by the film. The method also includes after applying the film, mounting one or more lower components within the die area so that there is a gap between the one or more lower components and the packaging substrate. The method also includes after mounting the one or more lower components, depositing an under-fill material on the packaging substrate so that the under-fill material penetrates into the gap. The method also includes after depositing the under-fill material, removing the film from the underside of the packaging substrate.

In some embodiments, the method further includes mounting through-mold connections to the underside of the packaging substrate after removal of the film. In further embodiments, the through-mold connections include solder balls. In yet further embodiments, the method further includes singulating individual units from the packaging substrate to yield a plurality of dual-sided packages.

In some embodiments, the under-fill material includes a sealing resin or an epoxy. In some embodiments, the method further includes curing the under-fill material. In some embodiments, applying the film includes laser cutting openings in a tape adhesive and mounting strips to the film.

In some embodiments, the film is configured to control distribution of the under-fill material during deposition of the under-fill material. In further embodiments, the under-fill material contacts the film. In further embodiments, removing the film includes removing a portion of the under-fill material that covers the film. In further embodiments, removing the film further includes leaving the under-fill material deposited in the die area.

According to a number of implementations, the present disclosure relates to a method of fabricating a packaged radio-frequency (RF) device. The method includes mounting components to a first side of a packaging substrate. The method also includes mounting a lower component to a second side of the packaging substrate. The method also includes under-filling the lower component mounted on the second side of the packaging substrate with an under-filling agent. The method also includes deflashing a portion of the under-filling agent. The method also includes mounting solder balls to the second side of the packaging substrate after the portion of the under-filling agent has been deflashed.

In some embodiments, the portion of the under-filling agent that is deflashed includes under-filling agent that coats contact pads of the solder balls. In some embodiments, deflashing includes removing a thin layer of the under-filling agent. In some embodiments, a size of a keep out zone is reduced by deflashing a portion of the under-filling agent prior to mounting the solder balls.

In some embodiments, the second side of the packaging substrate includes a plurality of contact pads for mounting the solder balls. In further embodiments, the under-filling agent coats a portion of at least one of the plurality of contact pads. In further embodiments, deflashing includes removing the portion of the under-filling agent that coats the portion of the at least one of the plurality of contact pads.

According to a number of implementations, the present disclosure relates to a method for manufacturing packaged radio-frequency devices. The method includes mounting one or more lower components on an underside of a packaging substrate so that there is a gap between the one or more lower components and the packaging substrate, the packaging substrate having an upper side with one or more upper components mounted thereto, the underside of the packaging substrate having a die area and a contact pad area having a plurality of contact pads for through-mold connections. The method also includes after mounting the one or more lower components, depositing an under-fill material on the packaging substrate so that the under-fill material penetrates into the gap. The method also includes after depositing the under-fill material, deflashing a portion of the under-fill material that covers one or more targeted areas.

In some embodiments, the method further includes mounting through-mold connections to the underside of the packaging substrate after deflashing the portion of the under-fill material. In further embodiments, the through-mold connections include solder balls. In further embodiments, the methods further includes singulating individual units from the packaging substrate to yield a plurality of dual-sided packages.

In some embodiments, the under-fill material includes a sealing resin or an epoxy. In some embodiments, the method further includes curing the under-fill material. In some embodiments, the one or more targeted areas includes a portion of the contact pad area. In some embodiments, deflashing includes removing a thin layer of the under-fill material. In some embodiments, a size of a keep out zone is reduced by deflashing a portion of the under-fill material prior to mounting any through-mold connections to the underside of the packaging substrate.

In some embodiments, the under-fill material coats a portion of the contact pad area. In further embodiments, deflashing includes removing the portion of the under-fill material that coats the portion of the contact pad area.

According to a number of implementations, the present disclosure relates to a packaging substrate for a packaged radio-frequency (RF) device. The packaging substrate includes an insulating material forming a first side and a second side, the second side forming contact points for a ball grid array and a lower component, the contact points exposing electrically conducting material on the second side, the second side also forming a dam on the insulating material forming an area to receive under-fill agent during an under-fill process, the dam including a feature configured to block the spread of under-fill material during an under-fill process. The packaging substrate also includes one or more conducting layers formed within the insulating material. The packaging substrate also includes conducting paths electrically coupling contact pads formed on the insulating material to one of the one or more conducting layers.

In some embodiments, the dam is formed using a solder mask during fabrication of the packaging substrate. In some embodiments, the dam is photolithographically defined in the original substrate manufacturing process. In some embodiments, the dam includes a plurality of outcroppings. In some embodiments, the dam includes continuous elevated structures. In some embodiments, the dam includes a plurality of disconnected elongated raised features. In some embodiments, the dam defines a keep out region that includes contact points for the lower component and excludes contact points for the ball grid array. In some embodiments, the dam is configured to surround the contact points for the ball grid array.

According to a number of implementations, the present disclosure relates to a method of fabricating a packaged radio-frequency (RF) device. The method includes mounting components to a first side of a packaging substrate. The method also includes mounting a lower component to a second side of the packaging substrate. The method also includes mounting solder balls to the second side of the packaging substrate. The method also includes forming a dam on a second side of the packaging substrate after mounting the lower component and after mounting the solder balls. The method also includes under-filling the lower component mounted on the second side of the packaging substrate with an under-fill material such that the under-fill material at least partially contacts the dam formed on the packaging substrate.

In some embodiments, the dam is formed using an application method that includes jetting or needle dispensing. In some embodiments, the dam is configured to limit the distribution of the under-fill material to maintain the under-fill material a targeted distance from the solder balls while providing targeted coverage under and around the lower component. In some embodiments, the method further includes singulating individual units from the packaging substrate to yield a plurality of dual-sided packages. In some embodiments, the under-fill material includes a sealing resin or an epoxy. In some embodiments, the method further includes curing the under-fill material.

According to a number of implementations, the present disclosure relates to a method of fabricating a packaged radio-frequency (RF) device. The method includes mounting components to a first side of a packaging substrate. The method also includes forming a dam on a second side of the packaging substrate. The method also includes mounting a lower component to a second side of the packaging substrate after forming the dam. The method also includes mounting solder balls to the second side of the packaging substrate after forming the dam. The method also includes under-filling the lower component mounted on the second side of the packaging substrate with an under-fill material such that the under-fill material at least partially contacts the dam formed on the packaging substrate.

In some embodiments, the dam is formed using an application method that includes screen printing, jetting, or needle dispensing. In some embodiments, the dam is configured to limit the distribution of the under-fill material to maintain the under-fill material a targeted distance from the solder balls while providing targeted coverage under and around the lower component. In some embodiments, the method further includes singulating individual units from the packaging substrate to yield a plurality of dual-sided packages. In some embodiments, the under-fill material includes a sealing resin or an epoxy. In some embodiments, the method further includes curing the under-fill material.

According to a number of implementations, the present disclosure relates to a packaging substrate for a packaged radio-frequency (RF) device. The packaging substrate includes an insulating material forming a first side and a second side, the second side forming contact points for a ball grid array and a lower component, the contact points exposing electrically conducting material on the second side, the second side also forming trenches in the insulating material that include a feature to receive under-fill agent during an under-fill process. The packaging substrate also includes one or more conducting layers formed within the insulating material. The packaging substrate also includes conducting paths electrically coupling contact pads formed on the insulating material to one of the one or more conducting layers.

In some embodiments, the trenches are formed using a solder mask during fabrication of the packaging substrate. In some embodiments, the trenches do not expose electrically conducting material on the second side. In some embodiments, the trenches form continuous trench structures. In some embodiments, the trenches form a plurality of disconnected elongated trenches. In some embodiments, the trenches form a plurality of voids in the substrate. In some embodiments, the trenches define a keep out region that includes contact points for the lower component and excludes contact points for the ball grid array. In some embodiments, the substrate is configured to be singulated to yield a plurality of dual-sided packages.

According to a number of implementations, the present disclosure relates to a method of fabricating a packaged radio-frequency (RF) device. The method includes forming a trench in insulating material of a packaging substrate, the trench formed on an underside of the packaging substrate. The method also includes mounting components to an upper side of the packaging substrate. The method also includes mounting a lower component to the underside of the packaging substrate. The method also includes mounting solder balls to the underside of the packaging substrate. The method also includes under-filling the lower component mounted on the second side of the packaging substrate with an under-fill material such that the under-fill material at least partially fills the trench formed in the insulating material of the packaging substrate.

In some embodiments, the trench is configured to limit the distribution of the under-fill material to maintain the under-fill material a targeted distance from the solder balls while providing targeted coverage under and around the lower component. In some embodiments, the method further includes singulating individual units from the packaging substrate to yield a plurality of dual-sided packages. In some embodiments, the under-fill material includes a sealing resin or an epoxy. In some embodiments, the method further includes curing the under-fill material. In some embodiments, forming the trench includes using a solder mask process. In some embodiments, the trench includes continuous trench structures. In some embodiments, the trench includes a plurality of disconnected elongated trenches. In some embodiments, the trench includes a plurality of voids in the substrate. In some embodiments, forming the trench does not penetrate through the insulating material to a conductive layer. In some embodiments, the trench does not include conductive material. In some embodiments, the trench defines a keep out region that includes contact points for the lower component and excludes contact points for the solder balls.

According to a number of implementations, the present disclosure relates to a method of fabricating a packaged radio-frequency (RF) device. The method includes mounting components to a first side of a packaging substrate. The method also includes coating solder balls with a fluxing agent. The method also includes attaching the solder balls to a second side of the packaging substrate. The method also includes encapsulating the solder balls with an encapsulant that forms an obtuse angle with the packaging substrate. The method also includes attaching a lower component to the second side of the packaging substrate. The method also includes under-filling the lower component mounted on the second side of the packaging substrate with an under-filling agent such that the under-filling agent contacts the encapsulant.

In some embodiments, the encapsulant is a polymer. In some embodiments, the encapsulant is not removed in a cleaning process following attachment of the solder balls to the packaging substrate. In some embodiments, the encapsulant forms an obtuse angle to the solder balls. In some embodiments, the under-filling agent contacts the encapsulant and not the solder balls. In some embodiments, the method further includes singulating individual units from the packaging substrate to yield a plurality of dual-sided packages.

According to a number of implementations, the present disclosure relates to a method for manufacturing packaged radio-frequency devices. The method includes mounting one or more lower components within a die area on an underside of a packaging substrate so that there is a gap between the one or more lower components and the packaging substrate, the packaging substrate having an upper side with one or more upper components mounted thereto, the underside of the packaging substrate having the die area and a contact pad area having a plurality of contact pads for through-mold connections. The method also includes mounting the solder balls to the underside of the packaging substrate, the solder balls being coated with a fluxing agent that leaves behind a material that encapsulates the base of each solder balls, the material forming an encapsulant. The method also includes after mounting the solder balls, depositing an under-fill material on the packaging substrate so that the under-fill material penetrates into the gap.

In some embodiments, the encapsulant forms an obtuse angle with a surface of the underside of the packaging substrate and with a surface of the solder balls. In further embodiments, the obtuse angle is configured to reduce a surface energy driving force for capillary action of the under-fill material.

In some embodiments, the method further includes singulating individual units from the packaging substrate to yield a plurality of dual-sided packages. In some embodiments, the under-fill material includes a sealing resin or an epoxy. In some embodiments, the method further includes curing the under-fill material.

In some embodiments, the encapsulant is configured to control distribution of the under-fill material during deposition of the under-fill material. In further embodiments, the under-fill material contacts the encapsulant.

In some embodiments, the material is configured so that it is not removed during a cleaning process that follows solder ball attach reflow. In further embodiments, the material is a polymer. In some embodiments, the encapsulant is configured to reduce capillary action causing the under-fill material to wick around the solder balls.

According to a number of implementations, the present disclosure relates to a packaging substrate for a packaged radio-frequency (RF) device. The packaging substrate includes an insulating material forming a first side and a second side, the second side forming contact points for a ball grid array and a lower component, the contact points exposing electrically conducting material on the second side, the second side also forming trenches in the insulating material that include a feature to receive under-fill agent during an under-fill process, the second side also forming a dam on the insulating material forming an area to receive under-fill agent during an under-fill process, the dam including a feature configured to block the spread of under-fill material during an under-fill process. The packaging substrate also includes one or more conducting layers formed within the insulating material. The packaging substrate also includes conducting paths electrically coupling contact pads formed on the insulating material to one of the one or more conducting layers.

According to a number of implementations, the present disclosure relates to a method of fabricating a packaged radio-frequency (RF) device. The method includes forming a trench in insulating material of a packaging substrate, the trench formed on an underside of the packaging substrate. The method also includes forming a dam on the underside of the packaging substrate. The method also includes mounting components to an upper side of a packaging substrate. The method also includes mounting a lower component to the underside of the packaging substrate. The method also includes mounting solder balls to the underside of the packaging substrate. The method also includes under-filling the lower component mounted on the second side of the packaging substrate with an under-fill material such that the under-fill material at least partially flows into the trench or contacts the dam formed on the packaging substrate.

According to a number of implementations, the present disclosure relates to a method of fabricating a packaged radio-frequency (RF) device. The method includes forming a dam on an underside of the packaging substrate. The method also includes mounting components to an upper side of the packaging substrate. The method also includes mounting a lower component to the underside of the packaging substrate. The method also includes under-filling the lower component mounted on the second side of the packaging substrate with an under-fill material such that the under-fill material at least partially flows into the trench or contacts the dam formed on the packaging substrate. The method also includes deflashing a portion of the under-filling agent. The method also includes mounting solder balls to the underside of the packaging substrate.

According to a number of implementations, the present disclosure relates to a method of fabricating a packaged radio-frequency (RF) device. The method includes forming a trench in insulating material of a packaging substrate, the trench formed on an underside of the packaging substrate. The method also includes mounting components to an upper side of the packaging substrate. The method also includes mounting a lower component to the underside of the packaging substrate. The method also includes under-filling the lower component mounted on the second side of the packaging substrate with an under-fill material such that the under-fill material at least partially flows into the trench or contacts the dam formed on the packaging substrate. The method also includes deflashing a portion of the under-filling agent. The method also includes mounting solder balls to the underside of the packaging substrate.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
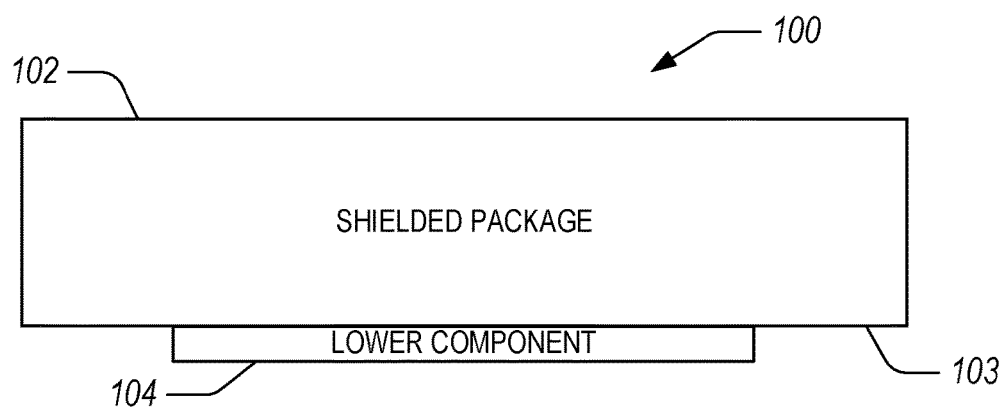
FIG. 1 illustrates a dual-sided package having a shielded package and a lower component mounted thereto.

The headings provided herein, if any, are for convenience only and do not necessarily affect the scope or meaning of the claimed invention.

Overview

Described herein are technologies related to fabrication of dual-sided packaged electronic modules, such as radio-frequency modules, and devices, systems, and methods to control the distribution of an under-fill material between one or more components and a packaging substrate. The disclosed technologies include applying a film to targeted areas on the packaging substrate prior to under-filling one or more components and prior to attaching solder balls. By applying the film to the packaging substrate prior to under-filling, the region that receives under-fill material can be controlled to a greater degree. After under-filling, the film can be removed to expose clean contact pads for the solder balls. Furthermore, because the solder balls are not present during under-fill, there is little capillary action drawing material away from the components being under-filled. This can advantageously reduce the frequency of voids under the components being under-filled. Accordingly, the disclosed systems, devices, and methods control under-fill for dual-sided ball grid array packages using a film prior to attaching solder balls of the ball grid array.

The disclosed technologies also include under-filling one or more components and deflashing a portion of the under-fill to remove under-fill material prior to attaching solder balls. By adding the deflashing step and adding solder balls after deflashing, the region that has under-fill material can be controlled to a greater degree. The deflashing step removes a thin layer of under-fill material that may have coated contact pads for the ball grid array. Furthermore, because the solder balls are not present during under-fill, there is little capillary action drawing material away from the components being under-filled. This can advantageously reduce the frequency of voids under the components being under-filled. Accordingly, the disclosed systems, devices, and methods control under-fill for dual-sided ball grid array packages using under-fill deflash prior to attaching solder balls of the ball grid array.

The disclosed technologies also include using a dam on a packaging substrate. The dam on the packaging substrate is configured to prevent or limit the flow of a capillary under-fill material. For example, the dam can form a controlled area so that the capillary under-fill material fills or flows substantially free within this area but does not flow outside of the area. This can prevent or limit the capillary under-fill material from flowing onto or contacting other components or elements on the packaging substrate, such as solder balls of a ball-grid array. Accordingly, the disclosed systems, devices, and methods control under-fill for dual-sided ball grid array packages using a dam on a packaging substrate.

The disclosed technologies also include forming a trench in a packaging substrate. The trench in the packaging substrate is configured to prevent or limit the flow of a capillary under-fill material. For example, the trench can form a controlled area so that the capillary under-fill material fills or flows substantially free within this area but does not flow outside of the area. This can prevent or limit the capillary under-fill material from flowing onto or contacting other components or elements on the packaging substrate, such as solder balls of a ball-grid array. Accordingly, the disclosed systems, devices, and methods control under-fill for dual-sided ball grid array packages using a trench on a packaging substrate.

The disclosed technologies also include using an encapsulant on solder balls to limit distribution of an under-fill agent. The encapsulant can be used in the ball attach process. The fluxing agent leaves behind a material that encapsulates the base of each solder ball. The encapsulant forms an obtuse angle with the substrate surface and with the ball surface. This reduces the tendency of the under-fill material to wick around the solder balls by capillary action. This can prevent or limit the capillary under-fill material from flowing onto or contacting other components or elements on the packaging substrate, such as solder balls of a ball-grid array. Accordingly, the disclosed systems, devices, and methods control under-fill for dual-sided ball grid array packages using an encapsulant on the solder balls.

In radio-frequency (RF) applications, RF circuits and related devices can be implemented in a packaged module. Such a packaged module can then be mounted on a circuit board such as a phone board. Certain packaged modules can include dual-sided packages, with components mounted over and under a packaging substrate. Such packaged modules can include an array of solder balls, or a ball grid array, on an underside of the packaging substrate, which collectively may be referred to as a dual-sided ball grid array (DS-BGA).

FIG. 1 illustrates a dual-sided package 100 having a shielded package 102 and a lower component 104 mounted thereto. For the purpose of description, a lower side of the shielded package 102 can include a side 103 of a packaging substrate that is to be mounted onto a circuit board such as a phone board. Although not shown separately in FIG. 1, it will be understood that the shielded package 102 can include such a packaging substrate and one or more upper components mounted on its upper side (when oriented as shown in FIG. 1). Accordingly, the dual-sided property can include such upper component(s) mounted over the substrate and lower component(s) mounted under the substrate.

The package can be shielded using any suitable shielding method. For example, the package 100 can be shielded using a plurality of shielding wires that are electrically coupled to a ground plane within the packaging substrate. The package 100 can be shielded using a conformal coating that is electrically coupled to a ground plane within the packaging substrate. Any suitable combination of features can be used to define a shielded volume or region. Such configurations can be implemented to provide shielding functionality between regions within and outside of the shielded package 100, and/or between regions that are both within the shielded package 100.

For the purpose of description, it will be understood that a lower component can include any device that can be mounted on the substrate and/or the circuit board. Such a device can be an active radio-frequency (RF) device or a passive device that facilitates processing of RF signals. By way of non-limiting examples, such a device can include a die such as a semiconductor die, an integrated passive device (IPD), a surface-mount technology (SMT) device, and the like. In some embodiments, the lower component as described herein can be electrically coupled to the one or more upper components through, for example, the substrate.

Figure 2:
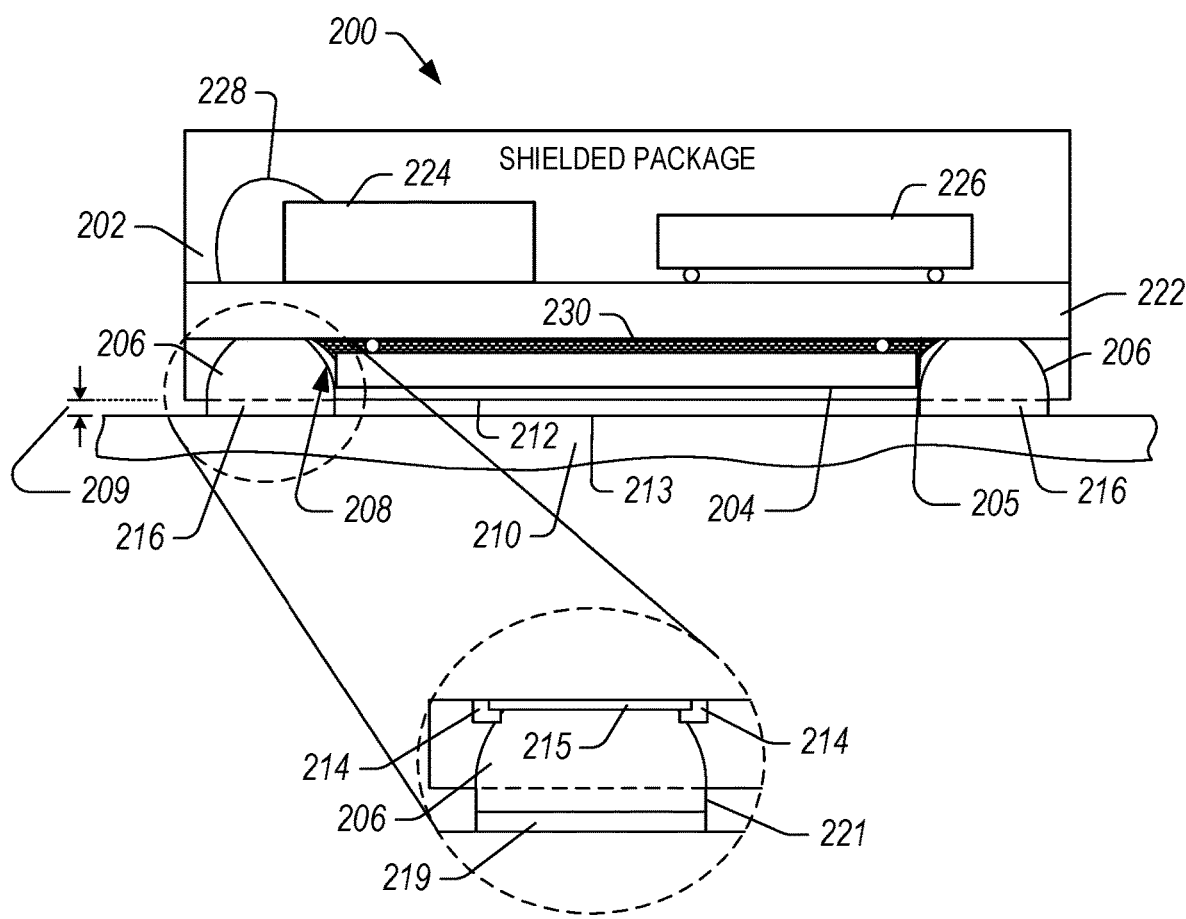
FIG. 2 illustrates another example of a dual-sided package having one or more lower components that can be mounted under a shielded package, generally within a volume defined on an underside of the shielded package.

FIG. 2 illustrates another example of a dual-sided package 200 having one or more lower components 204 that can be mounted under a shielded package 202, generally within a volume defined on an underside of the shielded package. In some embodiments, a set of through-mold connections (e.g., one or more through-mold connections) may be implemented, formed, located, and/or positioned on the underside (e.g., side 103 illustrated in FIG. 1) of the shielded package 202. The set of through-mold connections may define a volume on the underside of the shielded package 202. A volume 208 under a shielded package 202 is shown to be defined by the underside of the shielded package 202 and solder balls 206 of a ball grid array (BGA). The BGA may be a set of through-mold connections. For example, each solder ball 206 of the BGA may be a through-mold connection in the set of through-mold connections. Other examples of through-mold connections include, but are not limited to solder balls, pillars, columns, posts, pedestals, etc. The through-mold connections described herein may also be referred to as contact features. The solder balls 206 allow the dual-sided package 200 to be mounted on a circuit board 210 such as a phone board. The solder balls 206 can be configured so that when mounted to the circuit board 210, there is sufficient vertical space between the upper surface of the circuit board 210 and the lower surface of the shielded package 202 for the lower component 204. The volume 208 can be at least partially filled with an over-mold 205. The over-mold 205 substantially encapsulates the lower component 204. In certain embodiments, at least a portion of the solder balls 206 may be exposed through the over-mold 205. Exposing at least a portion of the solder balls 206 may provide a connection (e.g., an electrical and/or thermal connection) through the over-mold 205. For example, the solder balls 206 may provide a connection (e.g., an electrical connection) to the lower component 204 and/or upper components 224, 226 in the shield package 202. In various embodiments, solder (or other conductive material) may be applied to the exposed portion of the solder balls 206 to form a connection (e.g., electrical connection) with the circuit board 210. The over-mold 205 may also be referred to as an over-mold structure. In some embodiments, the over-mold 205 and/or the solder balls 206 (e.g., the exposed portions of the solder balls 206) may form a land grid array (LGA) type/style package.

A close-up view of the solder ball 206 is also illustrated in FIG. 2. As illustrated in the close-up view of the solder ball 206, the bottom of the shielded package includes a pad 215. The pad 215 may be a metallic pad (or some other material) that may provide electrical and/or thermal conductivity between the solder ball 206 and components of the shield package 202 and/or the lower component 204. Solder mask 214 may be deposited over portions of the pad 215 to define a location where the solder ball 206 may be formed. The solder ball 206 may be formed (e.g., implemented, formed, dropped, etc.) on top of the pad 215 and the solder mask 214.

The dual-sided package 200 may be installed on the circuit board 210 using the solder ball 206. The solder ball 206 may be attached to the circuit board 210 (e.g., may be installed, mounted, fixed, etc., to the circuit board 210) via connection 216. As illustrated in the close-up view of the solder ball 206, the connection 216 may include solder material 221 and pad 219. The solder material 221 may be solder material from the solder ball 206 that is deposited/melted onto the pad 219 when the dual-sided package 200 is attached to the circuit board. For example, during a reflow process, heat may be applied to melt at least a portion of the solder ball 206 to form the solder material 221. The solder material 221 may also include additional material that is formed, implemented, deposited, etc., over the solder ball 206. The pad 219 may be part of the circuit board 210. The pad 219 may provide electrical and/or thermal conductivity between the dual-sided package 200 and other components/circuits attached to the circuit board 210 (not illustrated in the figures). In some embodiments, the pad 219 may include solder material.

The over-mold 205 has a surface 212 (facing downward toward the circuit board 210). In some embodiments, the surface 212 may not contact (e.g., may not physically touch) the surface 213 of the circuit board 210. For example, a gap 209 may be present between the surface 212 and the surface 213. In some implementations, the gap 209 may help protect the lower component 204 from damage when there are linear displacements of the dual-sided package 200 due to flexing or dropping. For example, the gap 209 may help protect the lower component 204 from damage as the dual-sided package 200 is installed on the circuit board 200 (e.g., may prevent the lower component 204 from contacting the surface 213 of the circuit board 210 during installation/mounting of the dual-sided package). The portion of the over-mold material 205 that covers the lower component 204 may provide additional protection from damage when there are linear displacements of the dual-sided package 200 due to flexing or dropping. For example, the over-mold material 205 may also prevent the lower component 204 from contacting the surface 213 of the circuit board 210 during installation/mounting of the dual-sided package. In some embodiments, the gap 209 may also allow the dual-sided package 200 to adapt to process/manufacturing variations when the dual-sided package 200 is installed on the circuit board 210. For example, different temperatures may be used to melt the solder ball 206 during installation of the dual-sided package. The gap 209 may help ensure that the dual-sided package 200 is properly installed by providing enough distance between the surface 212 (of over-mold 205) and the surface 213 (of circuit board 210) while still allowing the solder material of the solder ball 206 to properly bond with the pad 219 of the circuit board 210. In some embodiments, although the over-mold 205 and/or the gap 209 may prevent the component 204 from contacting the surface 213 (of the circuit board 210), the dual-sided package 200 and/or the component 204 may still operate/function properly even if the component 204 does contact the surface 213. For example, the component 204 may remain undamaged and/or operable even after contacting the surface 213 of the circuit board 210.

The dual-sided ball grid array package 200 can include a packaging substrate 222 (e.g., a laminate substrate) and a plurality of components mounted thereon. For example, a first component 224 can be mounted on the upper surface of the packaging substrate 222, and electrical connections between the component 224 and the packaging substrate 222 can be facilitated by, for example, wire-bonds 228. In another example, a second component 226 is shown to be mounted on the upper surface of the packaging substrate 222 in a die-attach configuration. Electrical connections between the component 226 and the packaging substrate 222 can be facilitated by, for example, die-attach features.

In some embodiments, an under-fill can be provided between the lower component 204 and an underside of the dual-sided package 200. An under-fill 230 can be provided between the lower component 204 and the underside of the package 200 to provide, for example, a more secure mounting of the lower component 204.

Examples related to fabrication of dual-sided packages having similar configurations are described herein in greater detail. It will be understood that although such examples are described in the context of solder balls, other types of connection features that provide sufficient vertical space can also be utilized. Although the embodiments, examples, configurations, and/or implementations disclosed herein may refer to solder balls and/or a BGA, one having ordinary skill in the art understands that solder balls and/or a BGA are examples of through-mold connections. One having ordinary skill in the art understands that other types of through-mold connections (e.g., pillars, columns, etc.,) may be used to define a volume on an underside of a shielded package and an over-mold may be implemented in the volume (on the underside of the shielded package). In some embodiments, a through-mold connection (or a set of through-mold connections) may be any structure and/or component that may be used to define a volume on the underside of a shielded package and/or may be used to support the shielded package above a surface.

Examples of Fabricating Dual-Sided Ball Grid Array Packages

In a dual-sided ball grid array package structure, a zone is required between solder ball(s) and integrated circuit chips, dies, or other such components. This zone (sometimes referred to as a "keep out" zone) is a design rule that calls out a targeted minimum distance between solder ball and component. The keep out zone facilitates meeting manufacturing quality and reliability requirements. Defects such as voids under the component (e.g., an IC chip) where there is no under-fill material, or contamination of the solder balls with undesired material can occur if the keep out zone design rule is violated. It is advantageous to reduce the size of the keep out zone because it can enhance product performance and/or reduce package size. For example, the overall package size can be reduced and/or the chip size can be increased if the size of the keep out zone can be reduced. Decreasing the package size or increasing chip size may result in additional or improved functionality per unit area on the final product motherboard to which the dual-sided ball grid array package is mounted. Accordingly, described herein are systems, devices, and methods that advantageously reduce the keep out zone between solder balls and the IC chip in a dual-sided ball grid array package. This results in greater functionality per unit area when the package is mounted to the final product motherboard.

Typical fabrication techniques attempt to reduce or minimize the IC chip-to-solder ball keep out zone by controlling the capillary under-fill dispense process. This may be controlled through the needle selection, the dispense volume, the number of dispense passes, and/or the dispense temperature. By way of example, the keep out zone on the dispense side of the chip may be about 700 μm, and may be about 200 μm on the other three sides of the chip.

Figure 3A:
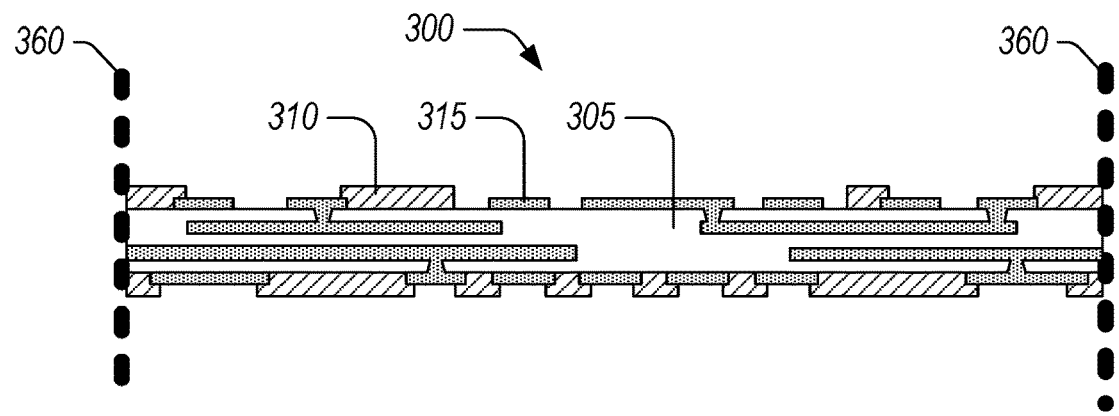
FIGS. 3A, 3B, 3C, 3D, 3E, 3F, 3G, 3H, and 3I illustrate a typical process flow for fabricating a dual-sided ball grid array package.
Figure 3B:
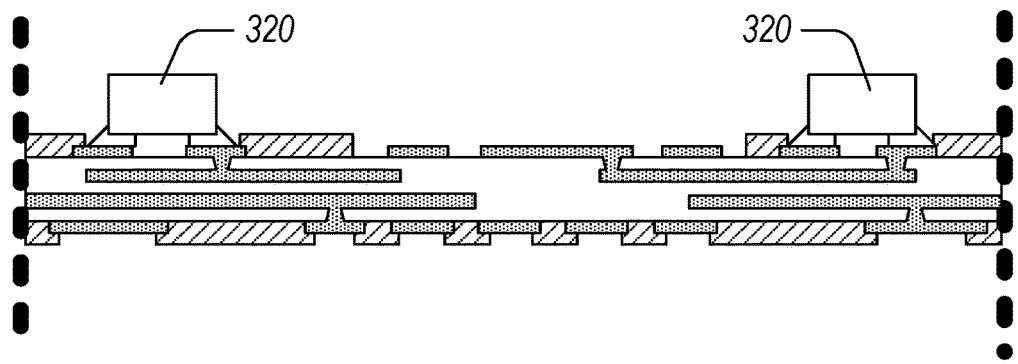
Figure 3C:
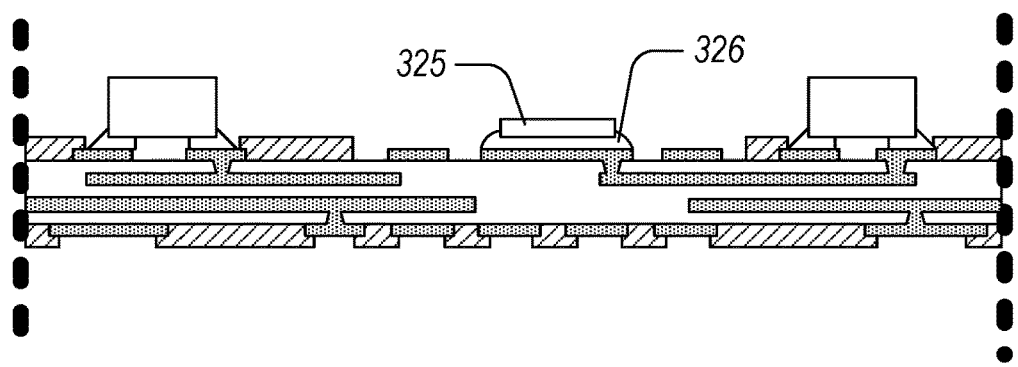
Figure 3D:
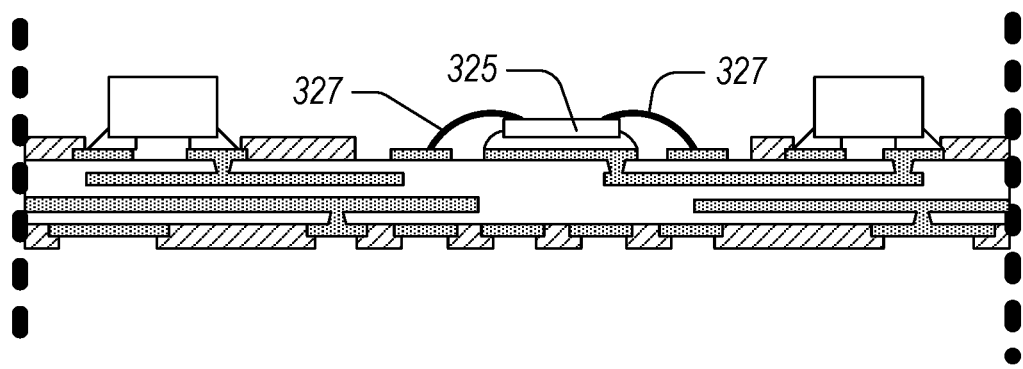
Figure 3E:
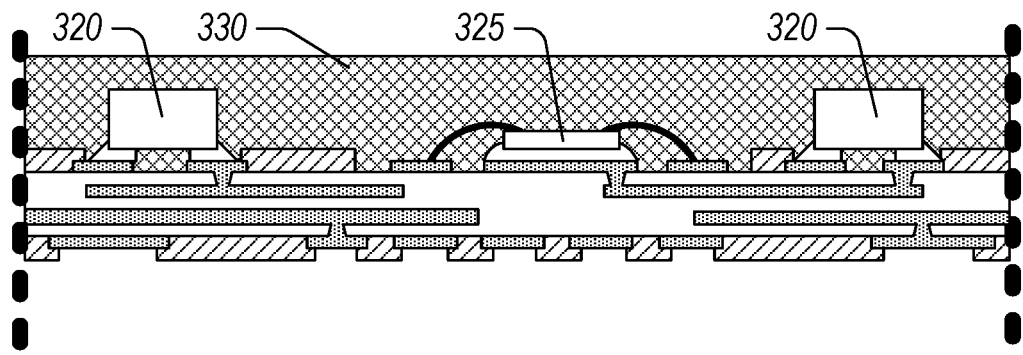
Figure 3F:
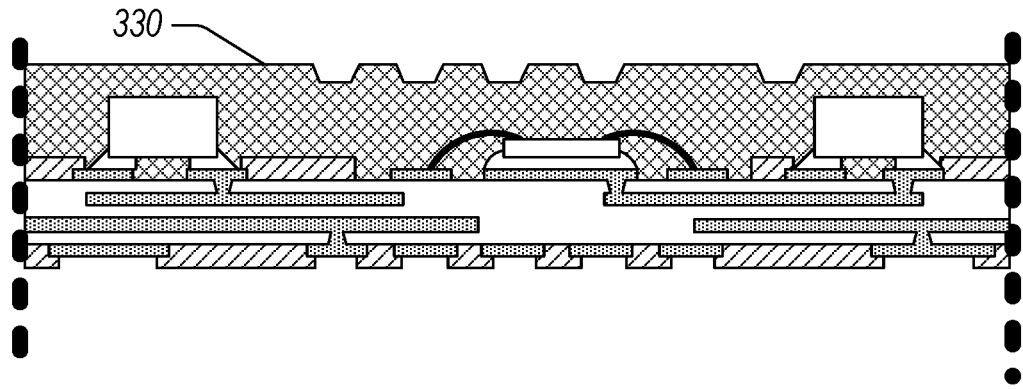
Figure 3G:
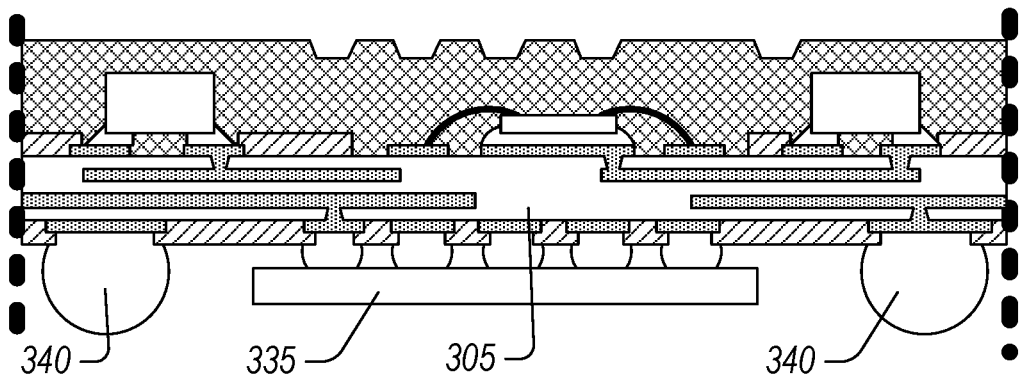
Figure 3H:
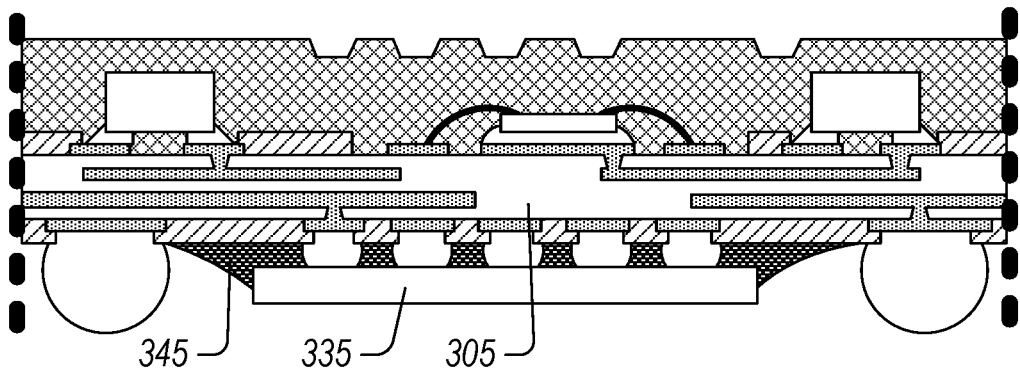
Figure 3I:
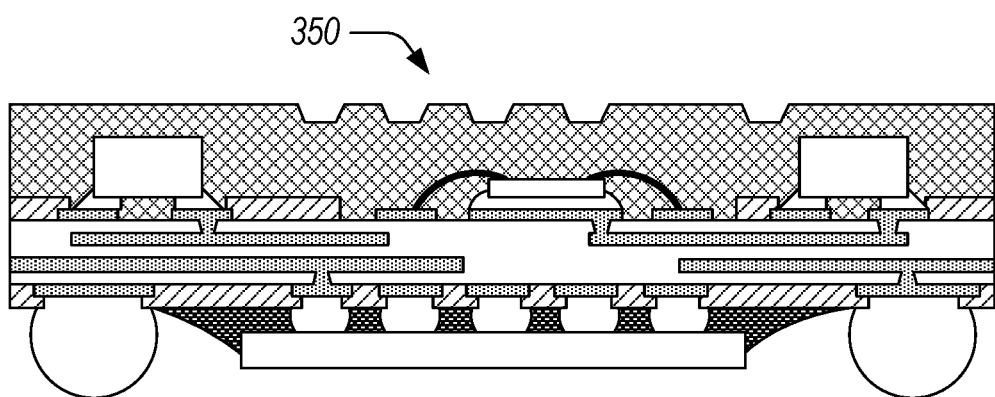
Figure 7A:
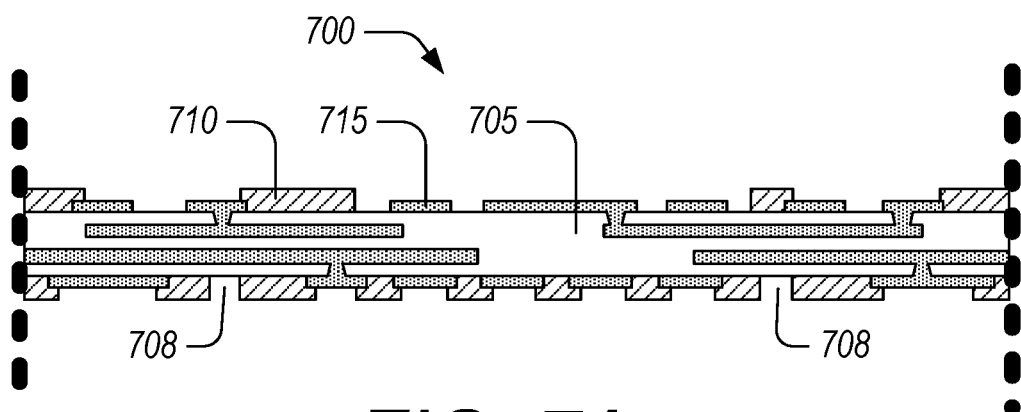
FIGS. 7A and 7B illustrate a modified fabrication process that uses a substrate with trenches on the underside of the substrate.
Figure 7B:
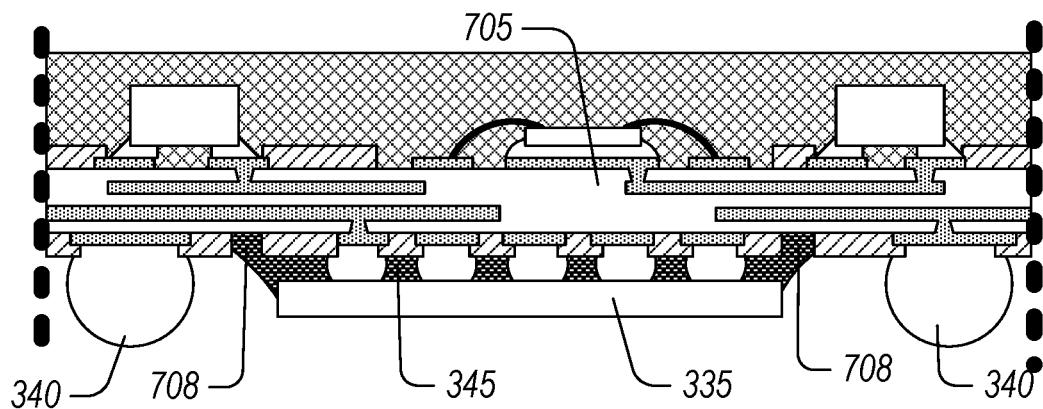
Figure 8A:
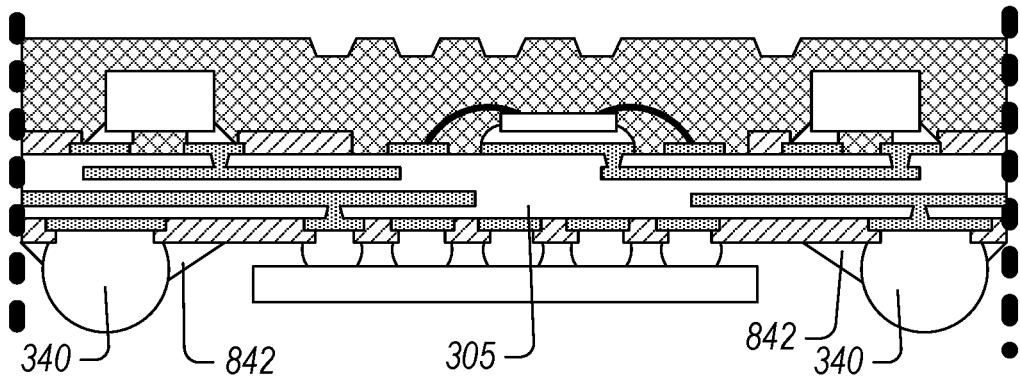
FIGS. 8A and 8B illustrate a modified fabrication process using encapsulant to control the distribution of an under-fill material.
Figure 8B:
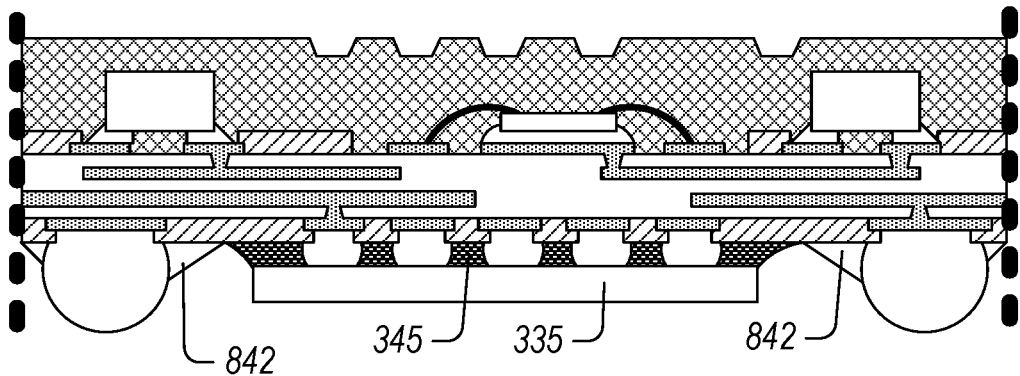

FIGS. 3A-3I illustrate a process flow for fabricating a dual-sided ball grid array package. FIGS. 3A-3F illustrate a process for completing a top side assembly of a laminate strip (e.g., surface mount, die attach, wire bond, molding, and marking). FIGS. 3G-3I illustrate a process for completing a bottom side assembly and forming individual packages through singulation. Optionally, a conformal shield material stack may be applied to individual packages. As illustrated in FIGS. 4A-4F, the present disclosure improves on this fabrication process by applying a film to the bottom side of the packaging substrate prior to under-filling to protect the contact pads of the solder balls of the ball grid array and to control the distribution of the under-filling material. In addition, as illustrated in FIGS. 5A-5D, the present disclosure improves on this fabrication process by under-filling and deflashing a portion of the under-fill material prior to adding the solder balls of the ball grid array. Moreover, as illustrated in FIGS. 6A-6D, the present disclosure improves on this fabrication process by forming a dam on the substrate to impede or prevent the capillary under-fill material from flowing into the solder balls. Furthermore, as illustrated in FIGS. 7A and 7B, the present disclosure improves on this fabrication process by forming a trench in the substrate to impede or prevent the capillary under-fill material from flowing into the solder balls. Additionally, as illustrated in FIGS. 8A and 8B, the present disclosure improves on this fabrication process by using an encapsulant on the solder balls to impede or prevent the under-fill material from flowing onto the solder balls.

FIGS. 3A-3I illustrate various stages of a fabrication process in which dual-sided features can be implemented in a panel format having an array of to-be-separated units, and separation of the array into individual units (also referred to as singulation). Although described in the context of BGA-based dual-sided packages, it will be understood that one or more features of the fabrication technique of FIGS. 3A-3I, 4A-4F, 5A-5D, 6A, 6B, 7A, 7B, 8A, and 8B can also be implemented for fabrication of dual-sided packages having other types of mounting features. In some implementations, the disclosed fabrication processes can be utilized for manufacturing dual-sided packages described herein and in U.S. Pat. No. 9,381,529 and U.S. patent application Ser. No. 15/724,722 (each of which has been expressly incorporated by reference herein).

FIG. 3A illustrates a cross-section view of a panel 300 having a plurality of to-be-singulated units. For example, singulation can occur at boundaries depicted by dashed lines 360 so at to yield singulated individual units. The panel 300 includes a substrate 305 on which components are to be mounted. The substrate 305 can be a laminate substrate, a ceramic substrate (e.g., a low-temperature co-fired ceramic substrate), or the like. The substrate 305 can include surface features 310 that may provide mechanical support. The panel 300 includes conductive material 315 that is configured to provide electrical connections between conductive layers, surface-mount devices, chips, solder balls, and the like. The conductive material 315 can form contact pads on the upper and lower sides of the substrate 305 to provide electrical contact points for surface mount devices, chips, solder balls, pillars, any combination of these, or the like. Vias can be formed in the substrate where the conductive material 315 provides an electrical connection between conductive layers in the panel 300.

FIG. 3B illustrates mounting of surface mount technology (SMT) devices 320 such that conductive points on the devices 320 are electrically coupled to contact pads formed by the conductive material 315 on the panel 300. By way of example, solder paste can be applied on the substrate 305 to allow mounting of one or more SMT devices 320. A reflow operation can be performed to melt the solder paste to solder the one or more SMT devices on their respective contact pads. Solder residue from the reflow operation can be removed by running the substrates through a solvent or aqueous cleaning step, for example.

FIG. 3C illustrates mounting of a die or chip 325. By way of example, adhesive 326 can be applied on one or more selected areas on the substrate 305. The die 325 can be positioned on the selected area with adhesive applied thereon. The adhesive 326 between the die 325 and the die-mounting area can be cured to secure the die 325.

FIG. 3D illustrates forming electrical connections between the die 325 and contact pads using wirebonds 327. The wirebonds 327 can provide electrical connections for signals and/or power to and from one or more circuits of the die 325.

FIG. 3E illustrates forming an over-mold 330 over the SMT component(s) 320, die(s) 325, and any other upper component on the substrate 305. By way of example, molding compound can be introduced from one or more sides of a molding volume to form an upper over-molded volume 330. In some embodiments, the over-mold 330 may completely encapsulate the upper components 320, 325.

FIG. 3F illustrates an optional process of marking the over-mold 330. By way of example, marking may be accomplished using laser etching or similar techniques.

FIG. 3G illustrates attaching a lower component 335 to the underside (which may face upward during fabrication) of the substrate 305. In addition, an array of solder balls 340 can be formed on the underside of the substrate 305. It will be understood that the lower component 335 may be attached for each unit after the array of solder balls 340 is formed, or vice versa. It shall also be understood that the lower component 335 and the array of solder balls 340 may be attached, implemented, and/or formed substantially simultaneously.

FIG. 3H illustrates filling a gap between the lower component 335 and the substrate 305 with an under-fill agent 345 or an under-fill material (also referred to as under-filling). By way of example, an under-fill material 345, such as a sealing resin or epoxy, can be deposited on the substrate 305 and the under-fill material 345 can penetrate into the gap between the lower component 335 and the substrate 305 by capillary forces. The coating shape and amount of under-fill agent 345 vary depending on the package size, pitch, and gap. The under-fill material 345 can be cured to provide mechanical support to the lower component 335, to provide advantageous thermal properties, to improve solder-ball bonding reliability under external stresses, and the like.

FIG. 3I illustrates singulating individual units to yield a plurality of dual-sided packages 350 substantially ready to be mounted to circuit boards.

Controlling Under-Fill Using a Film

To better control the size of the keep out area, the fabrication process illustrated in FIGS. 3A-3I can be improved by applying a film to the bottom side of the packaging substrate prior to adding the solder balls and prior to under-filling the lower component. Upon removal of the film, the solder balls can be added. The film protects the contact pads of the solder balls and controls the distribution of the under-filling agent.

Figure 4A:
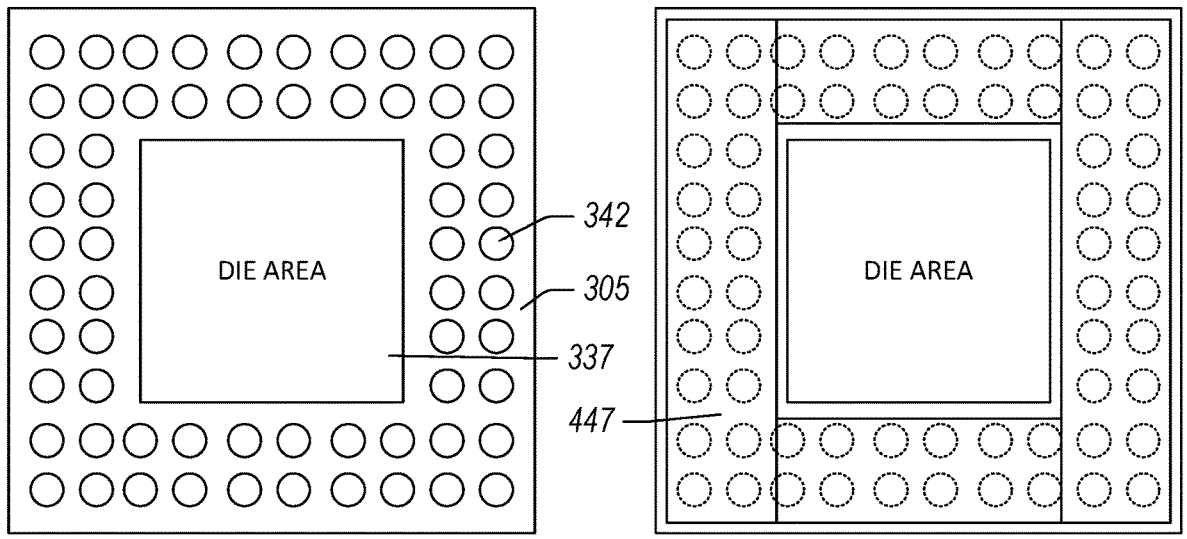
FIGS. 4A, 4B, 4C, 4D, 4E, and 4F illustrate a modified fabrication process that uses a film to control distribution of an under-fill material.

FIGS. 4A-4F illustrate a modified fabrication process, replacing steps illustrated in FIGS. 3G and 3H. FIG. 4A illustrates a substrate 305 with a die area 337 (e.g., for mounting one or more lower components) and a plurality of solder ball contact pads 342. A film 447 can be added to the substrate 305 to protect the solder ball contact pads 342 and to expose the die area 337 for mounting one or more lower components. The illustration on the left is shown without the film 447 while the illustration on the right is shown with the film 447.

Figure 4B:
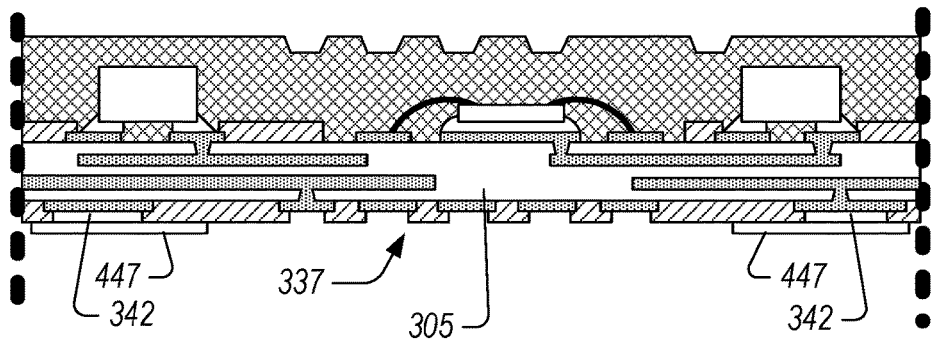

FIG. 4B illustrates the substrate 305 with the film 447 covering the contact pads 342 prior to addition of the lower component 335 and solder balls 340 and prior to under-filling the lower component 335. The film can be used to control the distribution of the under-filling agent, thereby making it possible to reduce the size of the keep out zone.

The process for applying the film 447 to the bottom side of the packaging substrate 305 can be similar to the process used in shielding DS-BGA packages. For example, openings can be laser cut in a tape adhesive. Strips can then be mounted to the film so that the film can protect the contact pads of the ball grid array from under-fill runout.

Figure 4C:
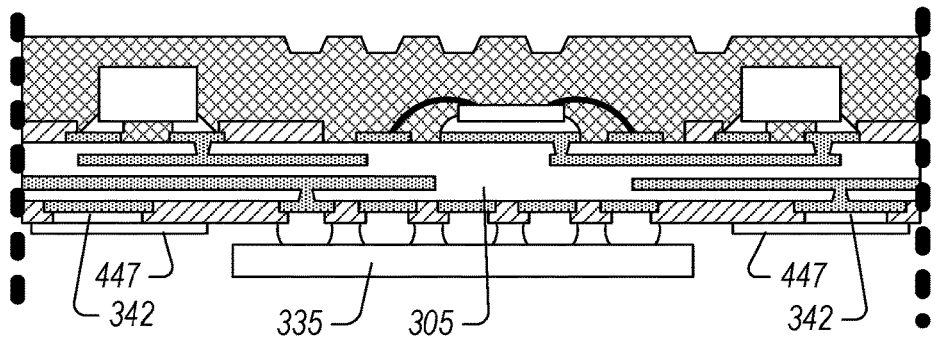

FIG. 4C illustrates that, after application of the film 447, the lower component 335 can be added, as described herein with reference to FIG. 3G. However, the solder balls of the ball grid array are not mounted to the substrate 305 as described in FIG. 3G.

Figure 4D:
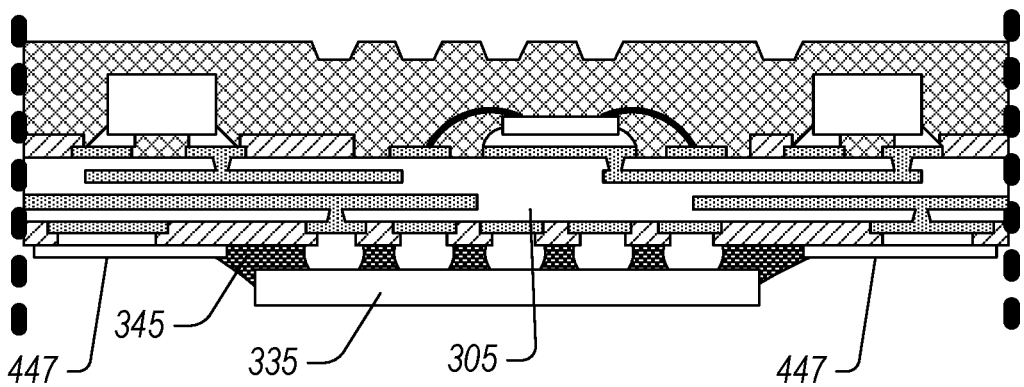

FIG. 4D illustrates that, after reflow and cleaning, the under-fill agent 345 can be applied as described herein with reference to FIG. 3H. However, there is a lack of capillary action drawing the under-fill material 345 toward the solder balls because the solder balls are not yet installed. This can reduce the occurrence of under-fill voids under the lower component 335. In addition, the film 447 prevents the under-fill material 345 from coating the solder ball contact pads 342.

Figure 4E:
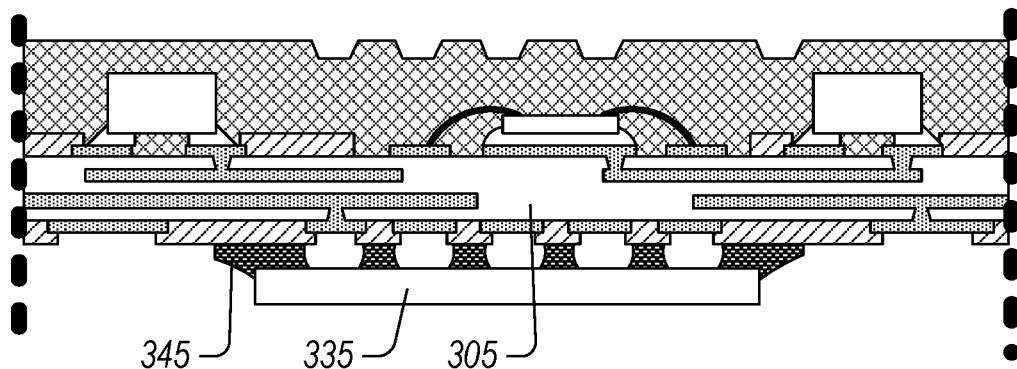

FIG. 4E illustrates an additional process step of removing the film 447. Removing the film 447 can prevent the under-fill material 345 from coating contact pads 342 of the solder balls and/or can remove any under-fill material 345 that would have coated those contact pads 342. In this way, the size and extent of the keep out zone can be controlled.

Figure 4F:
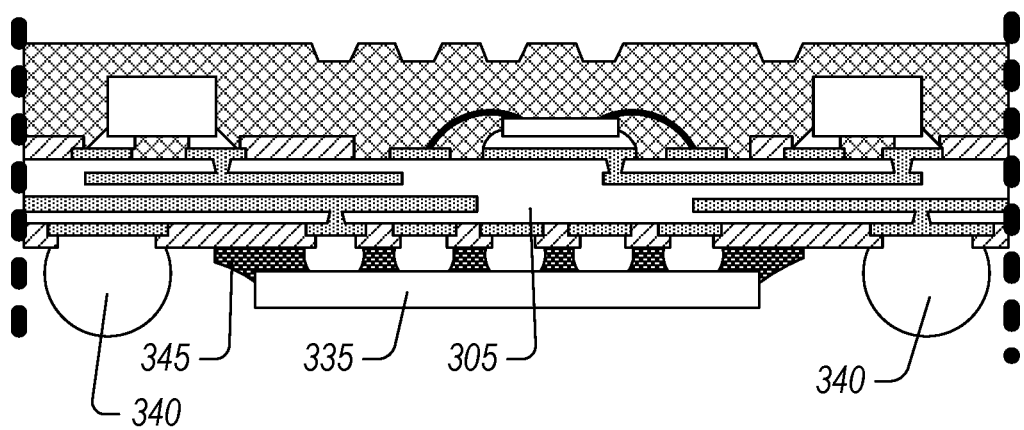

FIG. 4F illustrates that, after removal of the film 447, the solder balls 340 can be added as described in FIG. 3G. The process can then proceed to reflow again and then to singulate the individual units, as described herein with reference to FIG. 3I.

Controlling Under-Fill Using Deflashing

To better control the size of the keep out area, the fabrication process illustrated in FIGS. 3A-3I can be improved by adding the solder balls after under-filling the lower component and deflashing excess under-fill to control the distribution of under-fill agent.

Figure 5A:
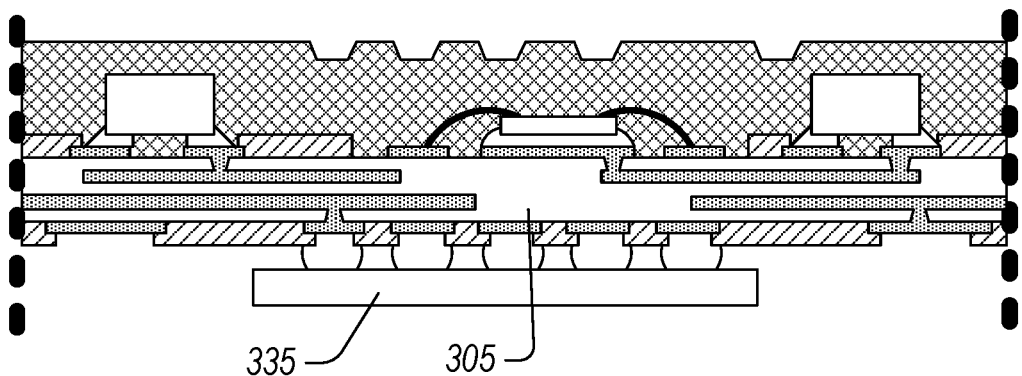
FIGS. 5A, 5B, 5C, and 5D illustrate a modified fabrication process using under-fill deflash to control the distribution of an under-fill material.
Figure 5B:
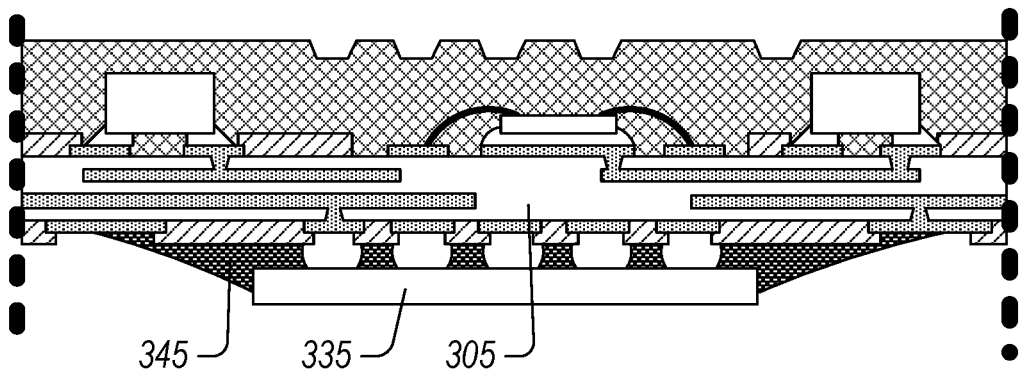

FIGS. 5A-5D illustrate a modified fabrication process, replacing steps described herein with reference to FIGS. 3G and 3H. In FIG. 5A, a lower component 335 is added as described in FIG. 3G. However, the solder balls of the ball grid array are not mounted to the substrate 305 as described in FIG. 3G. In FIG. 5B, the under-fill material 345 is applied as described in FIG. 3H. However, there is a lack of capillary action drawing the under-fill material 345 toward the solder balls because the solder balls are not yet installed. This can reduce the occurrence of under-fill voids under the lower component 335.

Figure 5C:
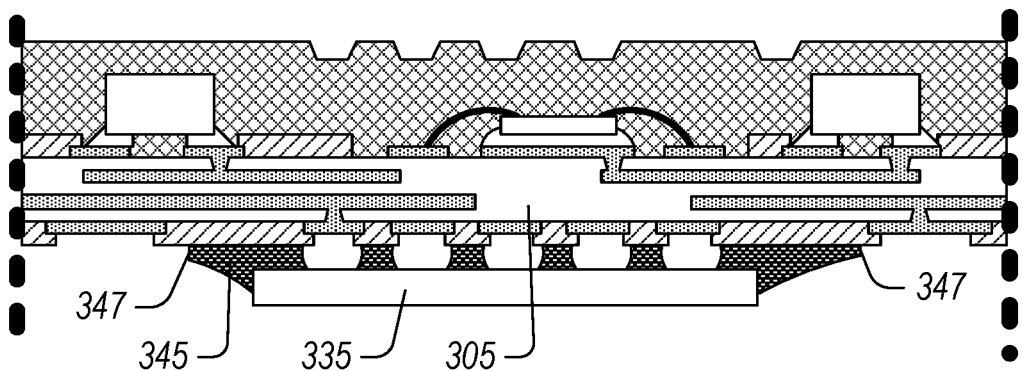
Figure 5D:
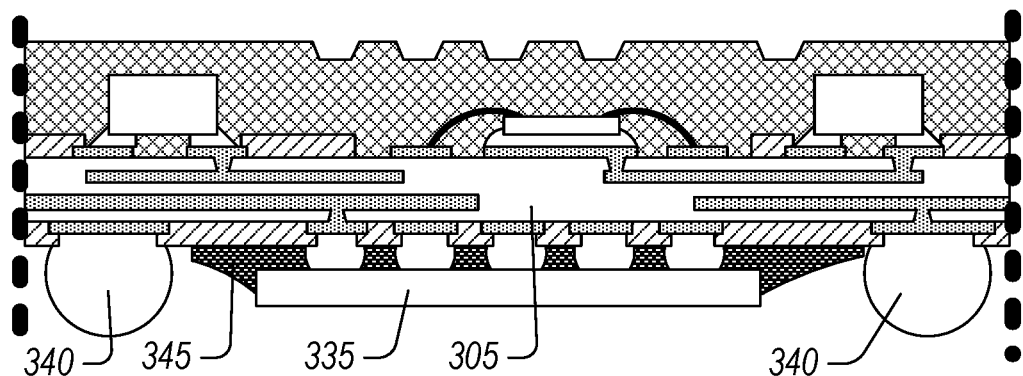

FIG. 5C illustrates an additional process step of deflashing the under-fill material 345. Deflashing is configured to remove a thin layer of under-fill material from targeted locations 347 on the substrate. For example, deflashing can remove under-fill material that may have coated the contact pads for the solder balls. In this way, the size and extent of the keep out zone can be controlled. FIG. 5D illustrates that, after deflashing, the solder balls 340 can be added as described in FIG. 3G.

Controlling Under-Fill Using a Dam

To better control the size of the keep out area, the fabrication process illustrated in FIGS. 3A-3I can be improved by forming a dam or a series of raised features on the substrate 305, wherein the dam or similar features is configured to control the distribution of under-fill agent in the process step illustrated in FIG. 3H.

Figure 6A:
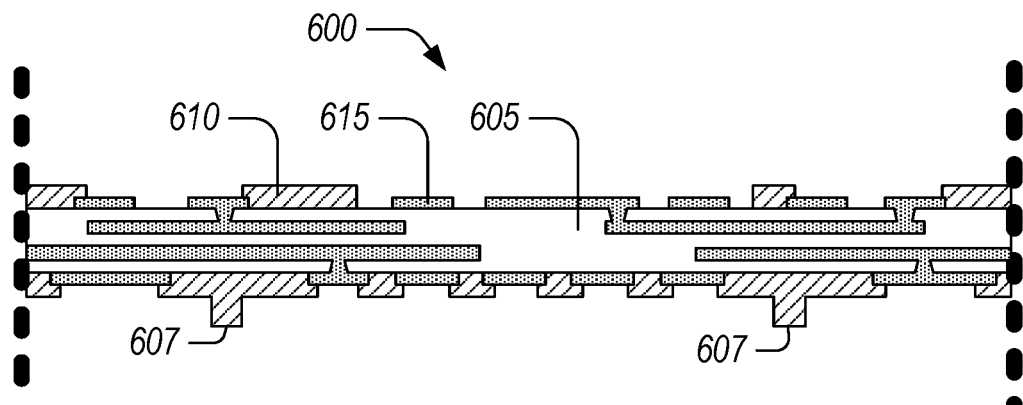
FIGS. 6A, 6B, 6C, and 6D illustrate a modified fabrication process that includes using a dam to contain an under-fill material.
Figure 6B:
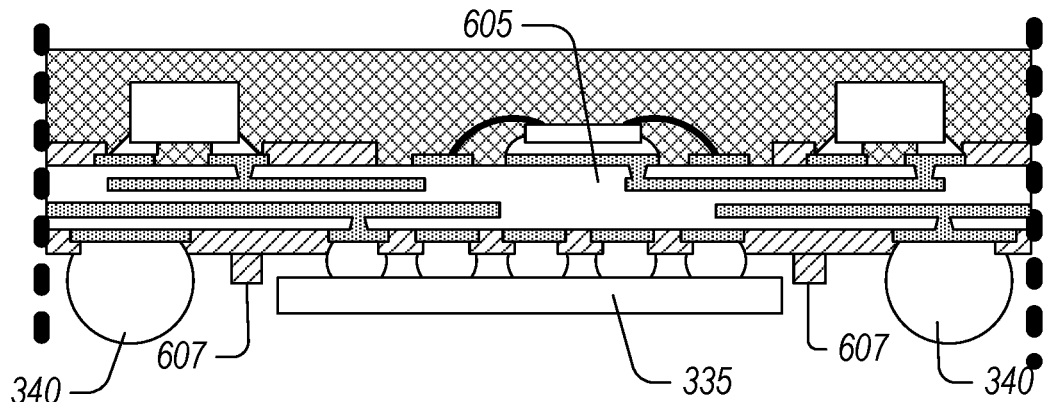
Figure 6C:
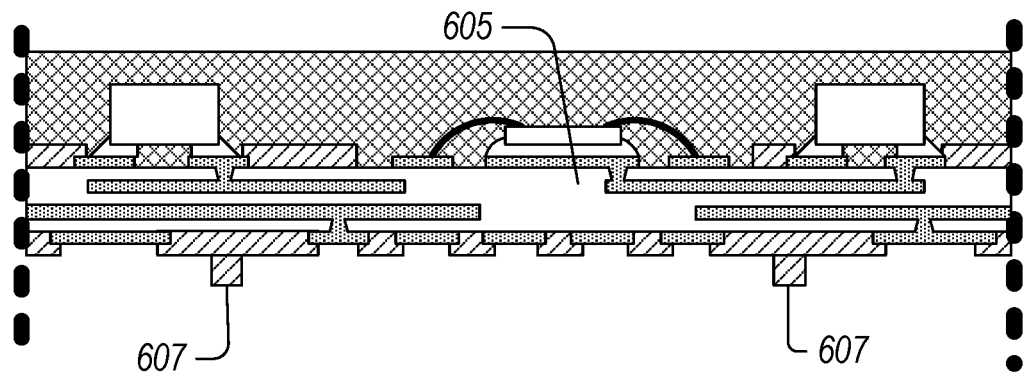

As illustrated in FIGS. 6A-6C, a panel 600 can be provided wherein the substrate 605 includes a dam 607 on the underside of the substrate 605, wherein the dam 607 can be an integral part of the substrate 605 or formed on the substrate 605 at a later time. The dam 607 provides a way to control the distribution of the under-fill agent during manufacturing of the disclosed double-sided ball grid array packages. The dam 607 contains the capillary under-fill material and may prevent it from contacting or contaminating the solder balls 340. The dam 607 can provide a repeatable volume of material to flow under the lower component 335 (e.g., a die), which reduces the frequency of voiding under the lower component 335. Although the dam 607 is illustrated on a single side of the solder balls 340, it is to be understood that the dam 607 can be configured to surround the solder balls 340. For example, the dam 607 can be configured to have raised features on a plurality of sides of the solder balls 340. The dam 607 can surround individual solder balls 340 and/or surround or enclose the area that contains the solder balls 340.

The substrate 605 can be a laminate substrate, a ceramic substrate (e.g., a low-temperature co-fired ceramic substrate), or the like. The substrate 605 can include surface features 610 that may provide mechanical support. The panel 600 includes conductive material 615 that is configured to provide electrical connections between conductive layers, surface-mount devices, chips, solder balls, and the like. The conductive material 615 can form contact pads on the upper and lower sides of the substrate 605 to provide electrical contact points for surface mount devices, chips, solder balls, pillars, any combination of these, or the like.

Vias can be formed in the substrate 605 where the conductive material 615 provides an electrical connection between conductive layers in the panel 600. The dam 607 can form continuous elevated structures, a plurality of disconnected elongated raised features, or a plurality of outcroppings in the substrate 605. The dam 607 can define one or more keep out areas on the underside of the substrate 605.

FIG. 6A illustrates that the dam 607 forms part of the substrate 605. In some embodiments, the dam 607 can be formed during an additional solder mask process during fabrication of the substrate 605. In some embodiments, the panel 600 includes a substrate 605 having insulating material forming an upper side and a lower side. The substrate 605 forms voids in which conducting material electrically couples contact pads to conductive layers or other contact pads. The substrate 605 forms a dam 607 (e.g., elevated features, connected raised features, disconnected raised features, etc.) in the insulating material to form a feature that can block the spread of under-fill material during an under-fill process. The dam 607 can be photolithographically defined during the original substrate manufacturing process. Then, when assembling the bottom side of the panel 600, the process flow illustrated in FIGS. 3A-3I can be used.

FIG. 6B illustrates that the dam 607 can be added to the substrate 605 during fabrication after the ball and die attach process steps, illustrated in FIG. 3G. To apply the dam 607, jetting or needle dispensing may be used.

FIG. 6C illustrates that the dam 607 can be added to the substrate 605 during fabrication before the ball and die attach process steps, illustrated in FIG. 3G. To apply the dam 607, screen printing, jetting, or needle dispensing may be used.

Figure 6D:
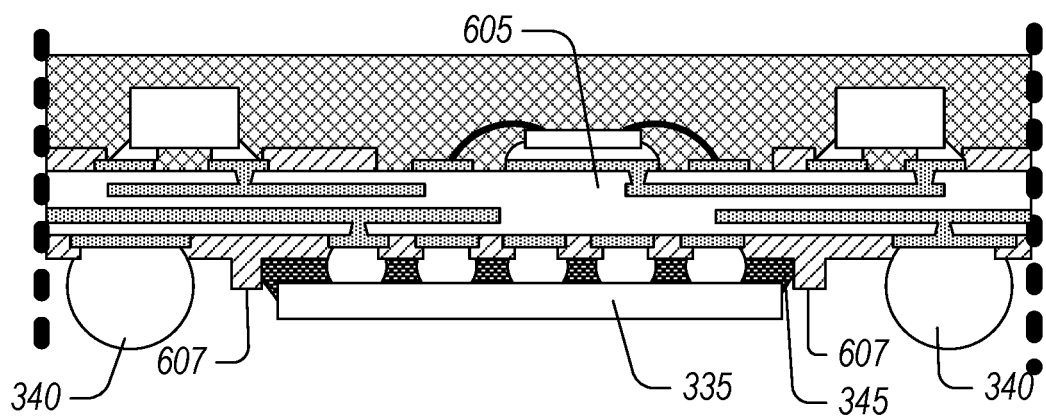

FIG. 6D illustrates the modified process of under-filling in the presence of the dam 607, compared to the under-filling process illustrated in FIG. 3H. The dam 607 limits the distribution of the under-fill material 345 to maintain the under-fill material 345 a targeted or desired distance from the solder balls 340 while still providing targeted coverage under and around the lower component 335.

Controlling Under-Fill Using a Trench

To better control the size of the keep out area, the fabrication process illustrated in FIGS. 3A-3I can be improved by forming a trench or a series of valleys, holes, or the like in the substrate 305, wherein these trenches or similar features are configured to control the distribution of under-fill agent in the process step illustrated in FIG. 3H.

As illustrated in FIG. 7A, a panel 700 can be provided wherein the substrate 705 includes trenches 708 on the underside of the substrate 705. The trenches provide a way to control the distribution of the under-fill agent during manufacturing of the disclosed double-sided ball grid array packages. The substrate 705 can be a laminate substrate, a ceramic substrate (e.g., a low-temperature co-fired ceramic substrate), or the like. The substrate 705 can include surface features 710 that may provide mechanical support. The panel 700 includes conductive material 715 that is configured to provide electrical connections between conductive layers, surface-mount devices, chips, solder balls, and the like. The conductive material 715 can form contact pads on the upper and lower sides of the substrate 705 to provide electrical contact points for surface mount devices, chips, solder balls, pillars, any combination of these, or the like. Vias can be formed in the substrate 705 where the conductive material 715 provides an electrical connection between conductive layers in the panel 700.

To form the trenches 708, vias can be formed in the substrate 705, but instead of providing conductive paths between conductive layers, the vias for the trenches 708 can provide a void in the substrate structure to receive under-fill agent during the under-fill processing step. By way of example, the trench 708 can be formed during a solder mask process during fabrication of the substrate 705. The trenches 708 can form continuous trench structures, a plurality of disconnected elongated trenches, or a plurality of voids or holes in the substrate 705. The trenches 708 can define one or more keep out areas on the underside of the substrate 705.

In some embodiments, the panel 700 includes a substrate 705 having insulating material forming an upper side and a lower side. The substrate 705 forms voids in which conducting material electrically couples contact pads to conductive layers or other contact pads. The substrate 705 forms trenches 708 (e.g., elongated voids) in the insulating material to form a feature that can receive under-fill material during an under-fill process. In some embodiments, the trenches 708 do not include conductive material or do not penetrate to a conductive layer.

FIG. 7B illustrates the modified process of under-filling in the presence of trenches 708 in the substrate 705, compared to the under-filling process illustrated in FIG. 3H. The trenches 708 limit the distribution of the under-fill material 345 to maintain the under-fill material 345 a targeted or desired distance from the solder balls 340 while still providing targeted coverage under and around the lower component 335.

Controlling Under-Fill Using Encapsulant

To better control the size of the keep out area, the fabrication process illustrated in FIGS. 3A-3I can be improved by using a special material during the ball attach process illustrated in FIG. 3G. As illustrated in FIG. 8A, a fluxing agent can be used on the solder balls 340 that leaves behind a material which encapsulates the base of each solder ball 340, forming encapsulant 842. This material may be a polymer. This material can be configured so that it is not removed during a cleaning process that follows solder ball attach reflow. The encapsulant 842 forms an obtuse angle with the surface of the substrate 305 and with the surface of the solder balls 340.

When the under-fill material 845 is dispensed in the process step illustrated in FIG. 8B, it no longer has a tendency to wick around the solder balls 340 by capillary action. The obtuse angles formed by the encapsulant 842 reduce the surface energy driving force for capillary action. This reduces or prevents the under-fill material from flowing around the solder balls 340. Instead, the under-fill material 345 primarily flows under the lower component 335 (e.g., an IC chip).

Controlling Under-Fill Using a Combination of Features

Figure 9A:
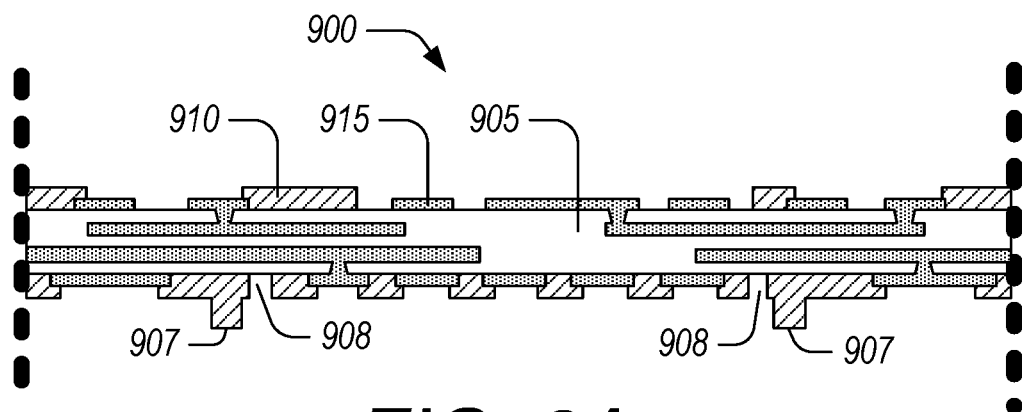
FIGS. 9A and 9B illustrate a panel with a dam or a series of raised features in conjunction with a trench or a series of valleys, holes, or the like in a substrate, wherein the dam and the trench are configured to control the distribution of an under-fill material.
Figure 9B:
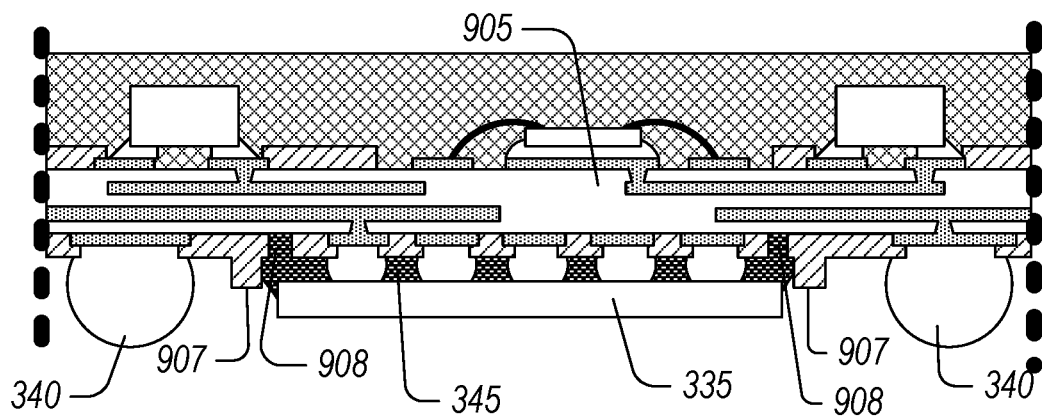

To better control the size of the keep out area, the fabrication process illustrated in FIGS. 3A-3I can be improved by combining features and techniques described herein with respect to FIGS. 4A-4F, 5A-5D, 6A-6D, 7A, 7B, 8A, and 8B. For example, a dam (e.g., as described herein with reference to FIGS. 6A-6D) can be used in combination with a trench (e.g., as described herein with reference to FIGS. 7A and 7B), which is illustrated in FIGS. 9A and 9B. Other combinations can be implemented as well. For example, the dam can be used in conjunction with a film, deflashing, trench, and/or an encapsulant. As another example, the trench can be used in conjunction with a film, deflashing, dam, and/or an encapsulant. Similarly, deflashing can be used in conjunction with a film, dam, trench, and/or an encapsulant. As another example, the film can be used in conjunction with deflashing, dam, trench, and/or an encapsulant. Likewise, encapsulant can be used in conjunction with a film, dam, trench, and/or deflashing.

FIG. 9A illustrates a panel 900 with a dam 907 or a series of raised features in conjunction with a trench 908 or a series of valleys, holes, or the like in a substrate 905, wherein the dam 907 and the trench 908 are configured to control the distribution of under-fill agent 345.

The panel 900 can be provided wherein the substrate 905 includes the dam 907 on the underside of the substrate 905, wherein the dam 907 can be an integral part of the substrate 905 or formed on the substrate 905 at a later time. Similarly, the substrate 905 includes the trench 908 on the underside of the substrate 905. The dam 907 and the trenches 908 provide a way to control the distribution of the under-fill agent 345 during manufacturing of the disclosed double-sided ball grid array packages. For example, the combination of the dam 907 and the trenches 908 contains the capillary under-fill material 345 and may prevent it from contacting or contaminating the solder balls 340. The combination of the dam 907 and the trenches 908 can provide a repeatable volume of material to flow under the lower component 335 (e.g., a die), which reduces the frequency of voiding under the lower component 335. Although the combination of the dam 907 and the trenches 908 is illustrated on a single side of the solder balls 340, it is to be understood that the dam 907 and/or the trenches 908 can be configured to surround the solder balls 340.

The substrate 905 is similar to the substrate 605 and 705 described herein with reference to FIGS. 6A-6D, 7A, and 7B. For example, the substrate 905 can include surface features 910 that may provide mechanical support and conductive material 915 to provide electrical connections between layers and components. The dam 907 can form continuous elevated structures, a plurality of disconnected elongated raised features, or a plurality of outcroppings in the substrate 905. To form the trenches 908, vias can be formed in the substrate 905, but instead of providing conductive paths between conductive layers, the vias for the trenches 908 can provide a void in the substrate structure to receive under-fill agent during the under-fill processing step. The trenches 708 can form continuous trench structures, a plurality of disconnected elongated trenches, or a plurality of voids or holes in the substrate 705. The trenches 708 can define one or more keep out areas on the underside of the substrate 705. The combination of the dam 907 and the trenches 908 can define one or more keep out areas on the underside of the substrate 905.

In some embodiments, as described herein with reference to FIG. 6A, the dam 907 can be formed during an additional solder mask process during fabrication of the substrate 905. In some embodiments, the trench 908 can be formed during a solder mask process during fabrication of the substrate 905. Then, when assembling the bottom side of the panel 900, the process flow illustrated in FIGS. 3A-3I can be used. In some embodiments, the dam 907 can be added to the substrate 905 during fabrication after the ball and die attach process steps (e.g., as described herein with reference to FIG. 6B) or the dam 907 can be added to the substrate 905 during fabrication before the ball and die attach process steps (e.g., as described herein with reference to FIG. 6C).

FIG. 9B illustrates the modified process of under-filling in the presence of the combination of the dam 907 and the trench 908, compared to the under-filling process illustrated in FIG. 3H. The combination of the dam 907 and the trench 908 limits the distribution of the under-fill material 345 to maintain the under-fill material 345 a targeted or desired distance from the solder balls 340 while still providing targeted coverage under and around the lower component 335.

Terminology

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of fabricating a packaged radio-frequency (RF) device, the method comprising:
    forming a trench in insulating material of a packaging substrate so that the trench does not penetrate to a conductive layer of the packaging substrate, the trench formed on an underside of the packaging substrate;
    mounting electrical components to an upper side of the packaging substrate;
    forming an over-mold over the electrical components mounted to the upper side of the packaging substrate;
    mounting a lower electrical component to the underside of the packaging substrate;
    mounting solder balls to the underside of the packaging substrate; and
    under-filling the lower electrical component mounted on the second side of the packaging substrate with an under-fill material such that the under-fill material at least partially fills the trench formed in the insulating material of the packaging substrate, the void in the packaging substrate forming the trench not including conductive material.

2. The method of claim 1 wherein the trench is configured to limit the distribution of the under-fill material to maintain the under-fill material a targeted distance from the solder balls while providing targeted coverage under and around the lower electrical component.

3. The method of claim 1 further comprising singulating individual units from the packaging substrate to yield a plurality of dual-sided packages.

4. The method of claim 1 wherein the under-fill material includes a sealing resin or an epoxy.

5. The method of claim 1 further comprising curing the under-fill material.

6. The method of claim 1 wherein forming the trench includes using a solder mask process.

7. The method of claim 1 wherein the trench includes continuous trench structures.

8. The method of claim 1 wherein the trench includes a plurality of disconnected elongated trenches.

9. The method of claim 1 wherein the trench includes a plurality of voids in the substrate.

10. The method of claim 1 wherein the trench defines a keep out region that includes contact points for the lower electrical component and excludes contact points for the solder balls.

* * * * *